United States Patent [19]
Ishihara

[11] Patent Number: 5,956,602
[45] Date of Patent: Sep. 21, 1999

[54] DEPOSITION OF POLYCRYSTAL SI FILM

[75] Inventor: Shunichi Ishihara, Souraku-gun, Japan

[73] Assignee: Canon Kabushiki Kaisha, Tokyo, Japan

[21] Appl. No.: 08/611,616

[22] Filed: Mar. 8, 1996

[30] Foreign Application Priority Data

Mar. 10, 1995 [JP] Japan .................................. 7-051055
Mar. 10, 1995 [JP] Japan .................................. 7-051056
Mar. 10, 1995 [JP] Japan .................................. 7-051057

[51] Int. Cl.$^6$ .................................................. H01L 21/70
[52] U.S. Cl. ........................... 438/491; 438/507; 438/508
[58] Field of Search .................................. 438/478, 479, 438/491, 507, 508, 509

[56] References Cited

U.S. PATENT DOCUMENTS

| | | | |
|---|---|---|---|
| 5,019,887 | 5/1991 | Niwa et al. | 357/30 |
| 5,242,530 | 9/1993 | Sandhu et al. | |
| 5,288,658 | 2/1994 | Ishihara | 437/101 |
| 5,332,689 | 7/1994 | Batey et al. | |

OTHER PUBLICATIONS

R. Reif et al., Plasma Enhanced Chemical Vapor Deposition, in Thin Film Processes II, edited by Vossen et al., Academic Press, pp. 542–543 (no month given), 1991.

*Primary Examiner*—John F. Niebling
*Assistant Examiner*—Keith Christianson
*Attorney, Agent, or Firm*—Fitzpatrick, Cella, Harper & Scinto

[57] ABSTRACT

The present invention provides a method for depositing polycrystal Si films, including n-type and p-type polycrystal Si films, using a material gas, a doping gas, and hydrogen gas. This method comprises a film-forming time-period having:

(a) a time-period for depositing a film;

(b) a time-period for diffusing dopants in the deposited film; and (c) a time-period for treating the film surface with hydrogen plasma. According to this method, an n-type or p-type polycrystal Si film with excellent crystallinity can be provided using the material gas and the doping gas. Further, this method is able to proceed at a low temperature and achieve satisfactory structural relaxation of the resulting film.

39 Claims, 8 Drawing Sheets

DEPOSITION OF POLYCRYSTAL SI FILM

BACKGROUND OF THE INVENTION

1. Field of the Invention

The present invention relates to a method for depositing polycrystal Si film. More particularly, the present invention relates to a method for depositing a polycrystal Si film having excellent crystallinity and high conductivity.

2. Description of the Related Art

Conventionally, the following methods (a) and (b) have been known as examples of a method for depositing a polycrystal Si film:

(a) the thermal CVD for depositing a polycrystal Si film on a substrate by blowing a material gas, such as $SiH_4$, to a substrate heated at a high temperature and producing deposition species by decomposing the material gas utilizing thermal energy; and (b) a combination method of the CVD and annealing for depositing a polycrystal Si film on a substrate, which method comprises a step of preparing an amorphous Si film or a polycrystal Si film having small-diameter particles on a substrate by the CVD including glow discharge plasma decomposition, a step of melting the film using laser, infrared light, or electric furnace, and a step of chilling-treating the resultant film.

Since heat treatment at about 1000° C. or more is required for preparing a polycrystal Si film according to the above-mentioned methods, those materials, e.g., glass, metals, which are used as a substrate in general can not be employed for polycrystal Si film deposition. Therefore, a method for depositing a polycrystal Si film at a low temperature, 500° C. or less, has been in demand for using metals, glass, and the like as a substrate of the deposition.

According to a known method (c), the afore-described low temperature process is attained by decomposing a material gas by discharge or light. The plasma CVD and the photo CVD are typically used for decomposing a material gas. The Plasma CVD has the advantage of providing a faster film-deposition rate compared with the photo CVD. In general, according to those methods, it is possible to prepare a polycrystal Si film on a substrate maintained at a low temperature, such as from 300 to 450° C., when a material gas, e.g., $SiH_4$, $SiF_4$, or $Si_2H_6$, is diluted in a large amount of hydrogen gas and discharge electric power is increased.

However, the film prepared by the above method (c) contains a large portion of amorphous Si. Thus, satisfactory photoelectric transfer characteristic of the film is not obtained in some cases, moreover, the diameter of the crystallized particles becomes as small as 50 Å or less. It is considered that the reason for these problems is such that sufficient structural relaxation is not achieved in the film, since deposition species have been produced by a non-equilibrium reaction of glow discharge plasma, poured on the substrate, and trapped into the film. Therefore, a method for depositing a polycrystal Si film has been in demand, which method is able to proceed at a low temperature and attain satisfactory structural relaxation of the resultant film.

Method (d) is an example of simultaneously achieving the afore-mentioned low-temperature process and structural relaxation. In accordance with the method (d), during decomposition procedure, material-gas supply is stopped midway or a substrate is moved to another plasma space to which no material-gas is supplied. Thereby, the film deposition is periodically stopped and the film surface is exposed to hydrogen plasma in the course of deposition. As a result, structure relaxation of the film is achieved by chemical annealing with hydrogen radicals, improving the crystallinity of the film.

However, according to the method (d), the crystallinity of an n-type or p-type polycrystal Si film decreases when the film is prepared from a material gas mixed with a doping gas, such as $PH_3$, $B_2H_6$, or $BF_3$. In the case that the material gas alone is used without being mixed with a doping gas, a polycrystal Si film is produced with excellent crystallinity. Therefore, a method has been in demand for depositing an n-type or p-type polycrystal Si film with excellent crystallinity using a material gas and a doping gas.

SUMMARY OF THE INVENTION

In view of the above-described problems of the prior art, the present invention is aimed at providing a method for depositing an n-type or p-type polycrystal Si film with excellent crystallinity using a material gas and a doping gas, which method can proceed at a low temperature and achieve satisfactory structural relaxation of the resultant film. Another object of the present invention is to provide a method for depositing an n-type or p-type polycrystal Si film, which method can be carried out at a low temperature, achieve excellent crystallinity and satisfactory structural relaxation of the resultant film, and proceed such that the $SiF_n$ radicals and the dopant radicals are introduced at different times into a deposition space. Still another object of the present invention is to provide a method for depositing an polycrystal Si film which exhibits more excellent crystallinity and higher conductivity compared with a crystalline Si film prepared by a conventional glow discharge plasma technique using $SiH_4$ gas diluted in a large amount of hydrogen gas. Moreover, another object of the present invention is to provide a method for depositing an polycrystal Si film with excellent crystallinity, which method can proceed at low temperature at low cost. A further object of the present invention is to provide a method for depositing an polycrystal Si film with excellent crystallinity and high conductivity, which method can proceed at low temperature at low cost. In addition, another object of the present invention is to provide a method for depositing a polycrystal Si film using a material gas, a doping gas, and hydrogen gas, which method comprises a film-forming time-period composed of a time-period for depositing film, a time-period for diffusing dopants in the deposited film, and a time-period for treating the film surface with hydrogen plasma. Furthermore, another object of the present invention is to provide a method for depositing a polycrystal Si film using a material gas, a doping gas, and hydrogen gas, which method proceeds such that during the film-forming time-period, the hydrogen gas is continuously introduced into and high-frequency power is applied at all times to a deposition space, while the material gas and the doping gas are intermittently introduced at different times into the deposition space so as to repeat the following three time-periods in that order:

(i) a time-period ($t_1$) for introducing the material gas and hydrogen gas;

(ii) a time-period ($t_2$) for introducing the doping gas and hydrogen gas; and (iii) a time-period ($t_3$) for introducing hydrogen gas alone. Additionally, another object of the present invention is to provide a method for depositing a polycrystal Si film having the steps of:

generating hydrogen radicals by supplying energy to hydrogen gas in another space adjacent to a deposition space;

decomposing a material gas or a doping gas by said hydrogen radicals so as to generate radicals; and depositing a film by the radicals on a substrate placed in the deposition space;

wherein during the film-forming time-period, the hydrogen gas is continuously introduced into and the energy is applied at all times to another space adjacent to the deposition space, and the hydrogen radicals are continuously introduced into the deposition space while the material gas and the doping gas are intermittently introduced at different times into the deposition space so as to repeat the following three time-periods in that order:

(i) a time-period ($t_1$) for introducing the material gas and the hydrogen radicals;

(ii) a time-period ($t_2$) for introducing the doping gas and the hydrogen radicals; and (iii) a time-period ($t_3$) for introducing the hydrogen radicals alone.

Further, another object of the present invention is to provide a method for depositing a polycrystal Si film comprising the steps of:

generating $SiF_n$ (n=1 to 3) radicals, dopant radicals, and hydrogen radicals in separate spaces adjacent to a deposition space;

introducing the radicals into the deposition space:

generating the $SiF_1H_m$ (1+m≦3) radicals by gas-phase collision between the $SiF_n$ radicals and the hydrogen radicals in the deposition space; and depositing a polycrystal Si film by the $SiF_1H_m$ (1+m≦3) radicals on a substrate placed in a deposition space, wherein during the film-forming time-period, the hydrogen radicals are continuously introduced into the deposition space while the $SiF_n$ radicals and the dopant radicals are intermittently introduced at different times into the deposition space so as to repeat the following three time-periods in that order:

(i) a time-period ($t_1$) for introducing the $SiF_n$ radicals and the hydrogen radicals;

(ii) a time-period ($t_2$) for introducing the dopant radicals and the hydrogen radicals; and (iii) a time-period ($t_3$) for introducing the hydrogen radicals alone.

DETAILED DESCRIPTION OF THE PREFERRED EMBODIMENTS

Figure 1:
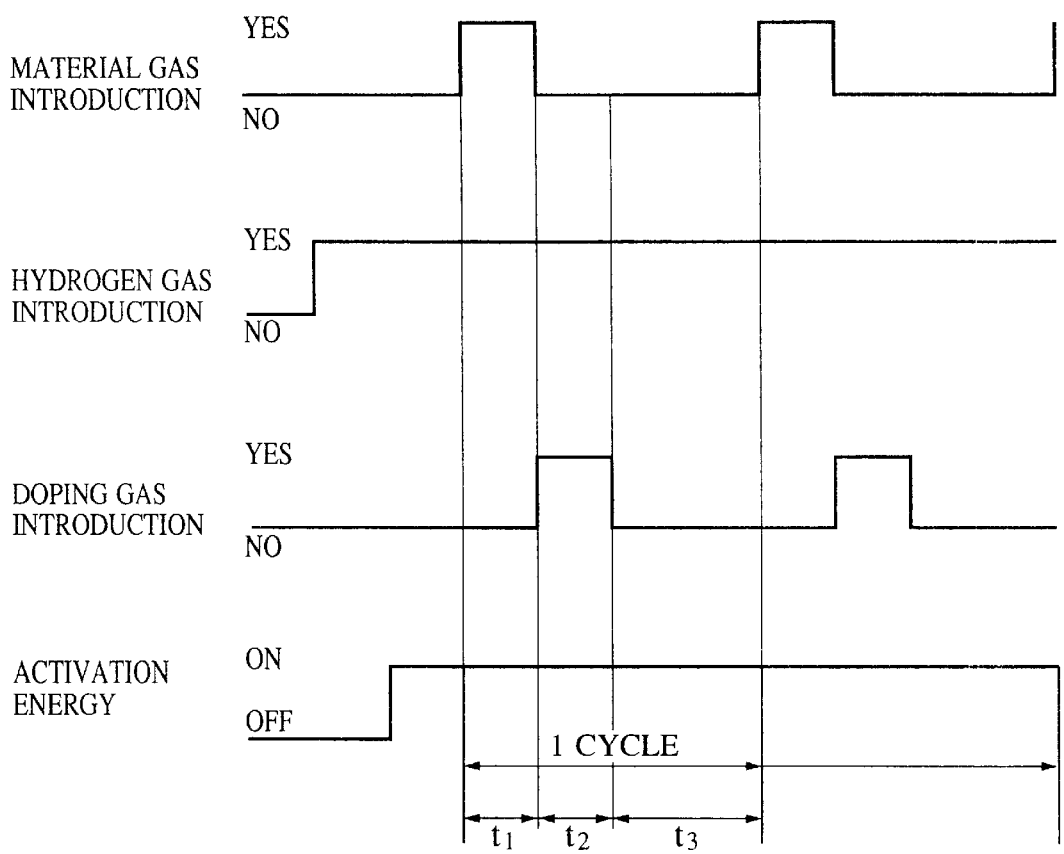
FIG. 1 is a schematic diagram showing the relation between the timing for gas introduction and energy supply according to the present invention.

In accordance with the present invention, while deposition is proceeding, hydrogen gas is continuously supplied for and high-frequency power is applied at all times to a deposition space. Under this condition, a material gas and a doping gas are intermittently introduced at different times into the deposition space, without overlapping. As a result, the film deposition can proceeds during the time-period ($t_1$) for introducing the material gas and the hydrogen gas, the dopant diffusion is able to be carried out during the time-period ($t_2$) for introducing the doping gas and the hydrogen gas, and the hydrogen plasma can be applied to the film surface during the time-period ($t_3$) for introducing the hydrogen gas alone. Due to these time-periods, it is possible to attain satisfactory structural relaxation of the film while maintaining a low-temperature process. In addition, an n-type or p-type polycrystal Si film with excellent crystallinity can be prepared from a material gas and a doping gas.

Moreover, a method for depositing a polycrystal Si film with more excellent crystallinity and higher conductivity can be achieved by setting up the time-period $t_3$ in a range of from 10 seconds or more to 90 seconds or less.

Further, according to the present invention, while deposition is proceeding, hydrogen gas is continuously supplied for and the microwave power is applied at all times to another space set up adjacent to the deposition space. Under this condition, a material gas and a doping gas may be intermittently introduced at different times into the space set up adjacent to the deposition space, without overlapping. As a result, the film deposition can proceed during the time-period ($t_1$) for supplying the material gas and the hydrogen gas, the diffusion of dopant can be carried out during the time-period ($t_2$) for supplying the doping gas and the hydrogen gas, and the hydrogen plasma can be applied to the film surface during the time-period ($t_3$) for supplying hydrogen gas alone. Due to these time-periods, it is possible to attain satisfactory structural relaxation of the film while maintaining a low temperature process. In addition, an n-type or p-type polycrystal Si film with excellent crystallinity is provided using a material gas and a doping gas. Furthermore, a method for depositing a polycrystal Si film with more excellent crystallinity and higher conductivity can be achieved by setting up the time-period $t_3$ in a range of from 10 seconds or more to 50 seconds or less.

Moreover, according to the present invention, the radicals of a material gas for deposition, such as the $SiF_n$ radicals, and the dopant radicals may be intermittently introduced at different times into a deposition space for which the hydrogen radicals are supplied at all times. In this case, the film deposition can proceed during the time-period ($t_1$) for supplying the radicals of a material gas for deposition, such as the $SiF_n$ radicals, and the hydrogen radicals, the dopant diffusion can be carried out during the time-period ($t_2$) for supplying the dopant radicals and the hydrogen radicals, and the hydrogen plasma can be applied to the film surface during the time-period ($t_3$) for supplying the hydrogen radicals alone. In the case that the gases are supplied to the deposition space after being activated to the radical condition, it is possible to attain satisfactory structural relaxation of the film while maintaining a low temperature process. In addition, an n-type or p-type polycrystal Si film with excellent crystallinity is provided even if the radicals of material gas deposition for deposition, such as the $SiF_n$ radicals, and the dopant radicals are employed. Further, a method for depositing a polycrystal Si film with more excellent crystallinity and higher conductivity can be achieved by setting up the time-period $t_3$ in a range of from 5 seconds or more to 50 seconds or less.

In any case, according to the present invention, a polycrystal Si film achieving the afore-mentioned objects is prepared by setting up a time-period for depositing a film, a time-period for diffusing dopant into the deposited film, and a time-period for treating the surface of the obtained film with the hydrogen plasma.

In addition, a polycrystal Si film with excellent crystallinity can be prepared at lower cost by employing $SiF_4$ or $SiH_4$ as the material gas for deposition.

Moreover, a polycrystal Si film with excellent crystallinity and high conductivity can be prepared at lower cost by employing $PH_3$ or $BF_3$ as the doping gas.

Further objects, features and advantages of the present invention will become apparent from the following description of the preferred embodiments with reference to the attached drawings.

Figure 2:
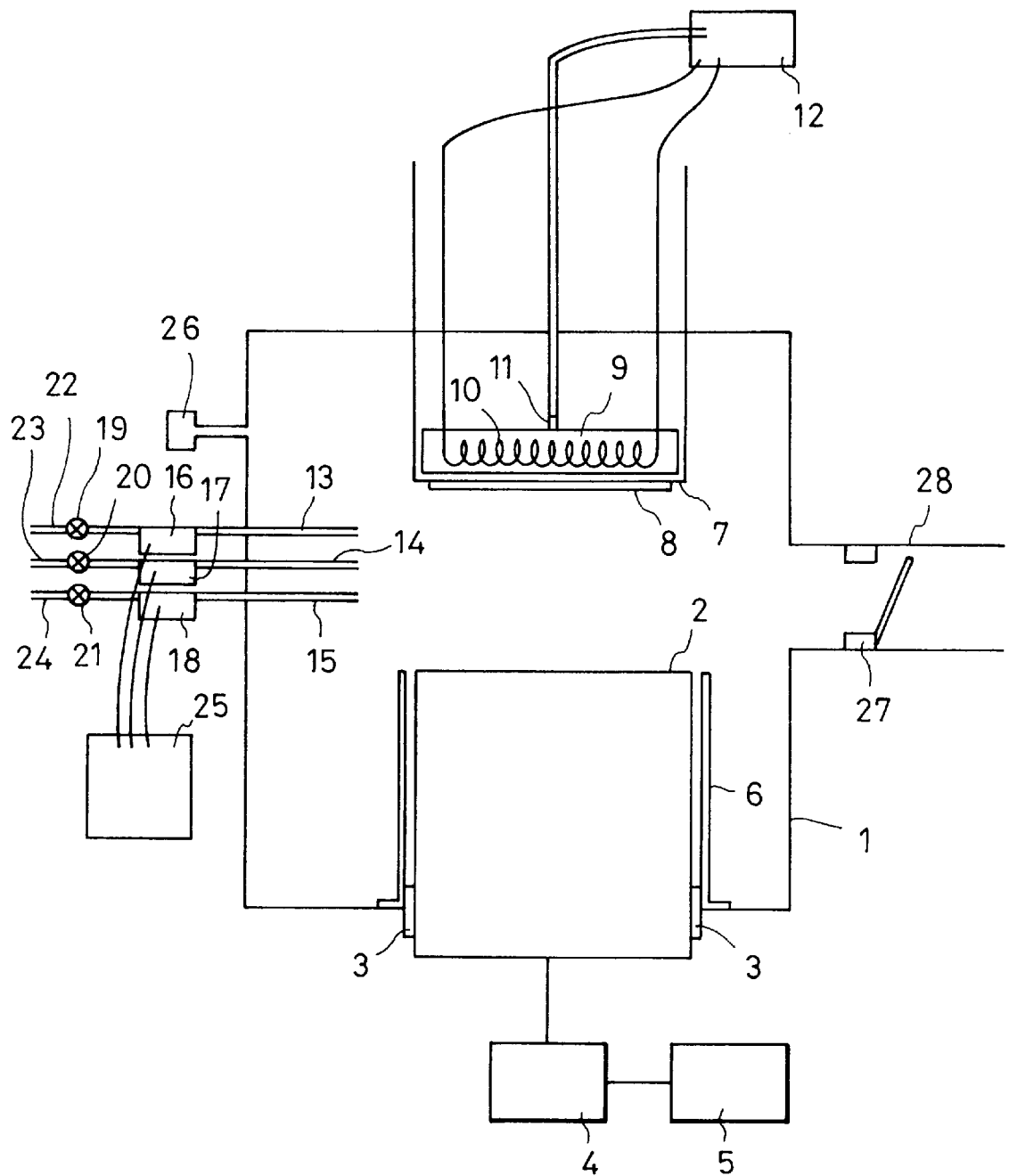
FIGS. 2, 3, and 5 are schematic diagrams illustrating construction of a preferred deposition apparatus according to the present invention.

A preferred embodiment of a method for depositing a polycrystal Si film according to the present invention will be described with reference to FIGS. 1 and 2. FIG. 1 is a schematic diagram showing the timing for introducing gases in accordance with the present invention. FIG. 2 is a schematic diagram illustrating construction of a deposition apparatus which can be used for the present invention. The timing for introducing the three kinds of gases and the timing for applying activation energy, such as high-frequency power or microwave power, for activating the gases will be described as follows.

In the present invention, deposition, dopant diffusion, and hydrogen plasma treatment are performed by activating each of the gases during the film-forming time-period as occasion calls. In any case, the hydrogen gas is continuously supplied, while the material gas for supplying main structural atoms for the deposited film and the doping gas for providing dopant by which the conductive type of the deposited film is controlled are intermittently supplied at different times, without overlapping.

Although all of the gases may be activated in the same space, e.g., a deposition space, a desired gas or gases, especially the continuously supplied hydrogen gas, may be activated in a different space or spaces from the deposition space, or all the gases may be activated in the different space or spaces.

An example of the activation energy is the high-frequency energy including radio frequency, very high-frequency (VHF), ultra high-frequency (UHF), and microwave. The high-frequency energy is applied to the hydrogen gas at least during the film-forming time-period. Other energy, e.g., light energy, may be employed as far as it can supply sufficient energy. In the following embodiment, all of the gases are activated in a deposition space.

While deposition is proceeding, hydrogen gas is continuously supplied for and high-frequency power is applied at all times to a deposition space in a deposition apparatus. Under this condition, a material gas, for instance, $SiH_4$, $SiF_4$, $S_2H_6$, or a mixture thereof, is intermittently introduced into the deposition space. During introduction of the material gas, film deposition proceeds. While the material gas is not supplied for the deposition space, the resultant film is treated with the hydrogen plasma and attains structural relaxation.

Meanwhile, when a doping gas, e.g., $PE_3$ or $BF_3$, is introduced with the material gas, the crystallinity of the resultant film decreases compared with that of the film obtained by not introducing the doping gas with the material gas. This phenomenon might be caused by the gas-phase reaction between the decomposition products from the doping gas or the reaction products thereof with the hydrogen radicals, and the decomposition products from the material gas or the reaction products thereof with the hydrogen radicals. In this case, it is difficult to improve the crystallinity even if the hydrogen-plasma-treatment time-period per cycle is sufficiently long.

Therefore, in the present invention, the material gas and the doping gas are introduced at different times, without overlapping. In consequence, it is possible to suppress the gas-phase reaction between the decomposition products of the doping gas and those of the material gas, preventing decrease in crystallinity caused by introducing the doping gas.

Referring to FIG. 2, there is shown a deposition apparatus which can be used for the afore-mentioned case. The construction of the apparatus will be described as follows. There is illustrated a vacuum chamber 1 having a deposition space and a cathode 2 for the plasma glow discharge. The vacuum chamber 1 and the cathode 2 are electrically insulated by an insulating ring 3. Via a matching box 4, the cathode 2 is connected to an RF power source 5, which has a frequency of 13.56 MHz and is used as a high-frequency power source. A shield tube 6 is installed for preventing discharge between the cathode 2 and the inner wall of the vacuum chamber 1. The distance between the cathode 2 and the shield tube 6 is, for instance, approximately 1 mm. According to Paschen's law, when the pressure is 1 Torr or less, there will be no discharge occurring between the cathode 2 and the shield tube 6, considering the gases used for the deposition.

The glow discharge occurs between the cathode 2 and an anode 7. A heater block 9 has a heater 10 embedded therein and is further provided with a thermo couple 11. The heater 10 and the thermo couple 11 connect to a temperature controller 12 so as to adjust the heater block 9 to a desired temperature, thereby a substrate 8 set up on the surface of the anode 7 is heated to a desired temperature.

In the figure, there is shown introduction conduits 13, 14, and 15 each for the material gas, the doping gas, and hydrogen gas, respectively. These introduction conduits are provided for supplying gases to the vacuum chamber 1. Flow-controllers 16, 17, and 18, and valves 19, 20, and 21 are set up for the corresponding introduction conduits 13, 14, and 15, and through corresponding gas conduits 22, 23, and 24, they are connected to corresponding gas bombs (not shown in the figure) for storing the corresponding gases and to corresponding pressure controllers (not shown in the figure) for controlling the releasing pressure. Each of the flow-controllers 16, 17, and 18 has a high response speed and electrically connects to a sequence programmer 25 to receive signals therefrom. Thus, each of the gases can be introduced into the vacuum chamber 1 at a desired flow rate for a desired duration.

A pressure gage 26 is provided for measuring pressure in the vacuum chamber 1 and transmits signals to the pressure controller (not shown in the figure). By comparing the signal from the pressure gage 26 with a predetermined pressure value, the pressure controller regulates opening and closing of an automatic butterfly valve 27 installed in an evacuation conduit 28 so as to maintain the vacuum chamber 1 to the predetermined pressure. The evacuation conduit 28 connects to an evacuation device (not shown in the figure).

In the following embodiment, the activated hydrogen gas is introduced into a deposition space with a material gas or a doping gas, wherein the material gas and the doping gas are not activated before the introduction.

While the deposition is proceeding, hydrogen gas is continuously supplied to another space, which is provided adjacent to the deposition space, so as to be activated by the microwave power applied thereto all the time. Then, the activated hydrogen atoms (the hydrogen radicals) are introduced into the deposition space. Under this condition, a material gas is intermittently supplied to the deposition space. As a result, the film deposition proceeds during the introduction of material gas, and the deposited film is treated with the hydrogen plasma and attains structural relaxation while the introduction of the material gas is stopped.

Meanwhile, when the doping gas is supplied with the material gas, the crystallinity of the resultant film decreases compared with that of the film obtained by not introducing the doping gas with the material gas. This phenomenon might be caused by the gas-phase reaction between the decomposition products from the doping gas or the reaction products thereof with the hydrogen radicals and the decomposition products from the material gas or the reaction products thereof with the hydrogen radicals. In this case, it is difficult to improve the crystallinity even if the hydrogen-plasma-treatment time-period per cycle is sufficiently long.

Therefore, the material gas and the doping gas are introduced at different times, without overlapping, as is shown in FIG. 1. In consequence, the gas-phase reaction between the decomposition products of the doping gas and these of the material gas can be suppressed, preventing the decrease in crystallinity caused by introducing the doping gas.

A deposition apparatus preferable for the present embodiment will be described as follows taken in conjunction with FIG. 3. A vacuum chamber 301 for film-forming and an evacuation device 304 are connected by an evacuation conduit 302. On the way from the evacuation device 304 to the vacuum chamber 301, the evacuation conduit 302 branches into two conduits connecting to the vacuum chamber 301 so as to provide a uniform gas flow. A pressure controller 306 controls opening and closing of an electrically driven butterfly valve 303 set up in the exhaust conduit 302 to maintain a desired pressure according to signals from a pressure gauge 305.

A substrate 308 for deposition is placed on the surface of a supporting base 307. A heater block 309 having a heater 310 embedded therein is further provided for the supporting base 307. A thermo couple 311 is set up on the heater block 309 so as to determine the temperature thereof similar to the apparatus shown in FIG. 2. The heater block 309 is adjusted to a predetermined temperature, which has been calibrated, by a temperature controller 312 so as to maintain the surface of the substrate 308 to a desired temperature.

Due to a bellows conduit 313, the supporting base 307 is vertically adjustable. The vacuum chamber 301 and the supporting base 307 are connected electrically.

The hydrogen gas is supplied from a gas introduction conduit 516 and activated by the microwave power, which introduced from a microwave waveguide 515 through an alminium microwave window 514 so as to generate the plasma glow discharge, producing the hydrogen radicals.

A flow-controller 317 for controlling hydrogen gas flow rate is connected with a hydrogen gas pressure controller (not shown in the figure) and a hydrogen gas bomb (not shown in the figure) through a gas conduit 319 via a valve 318.

The hydrogen radicals, which has been generated in a space 340 different from the deposition space, collide with the material gas and the doping gas introduced through a ring-shaped blowing conduit 320 into the vacuum chamber 301. Consequently, the gases are decomposed and react with the hydrogen radicals, thereby those radicals which can deposit a film are produced.

A gas introduction conduit 321 for introducing gas into the gas blowing conduit 320 is branched into two conduits on the way and connects to a material gas flow-controller 322 and a doping gas flow-controller 325, respectively.

The material gas flow-controller 322 is connected to a material gas pressure controller (not shown in the figure) and to a material gas bomb (not shown in the figure) through a gas conduit 324 via a valve 323. The doping gas flow-controller 325 is connected to a doping gas pressure controller (not shown in the figure) and to a doping gas bomb (not shown in the figure) through a gas conduit 327 via a valve 326.

A tapered portion 329 of the microwave waveguide 315 is provided for decreasing loss of the microwave power occurring when microwaves are introduced to the space 340. A waveguide 330 is set up for monitoring the microwave power and is provided with a detector 331 for monitoring the power of the incident microwaves and a detector 333 for monitoring the power of the reflected microwaves. The detectors 331 and 333 are connected with corresponding meters 332 and 334 so as to monitor the power of the incident microwaves and the reflected microwaves.

A microwave matching device 335, e.g., a microwave iris, is used for matching the microwave-power supplying system with the load, and a waveguide 336 is provided for connecting. An isolator 337 prevents the power of the reflected microwave from reaching a microwave power source 388.

Figure 3:
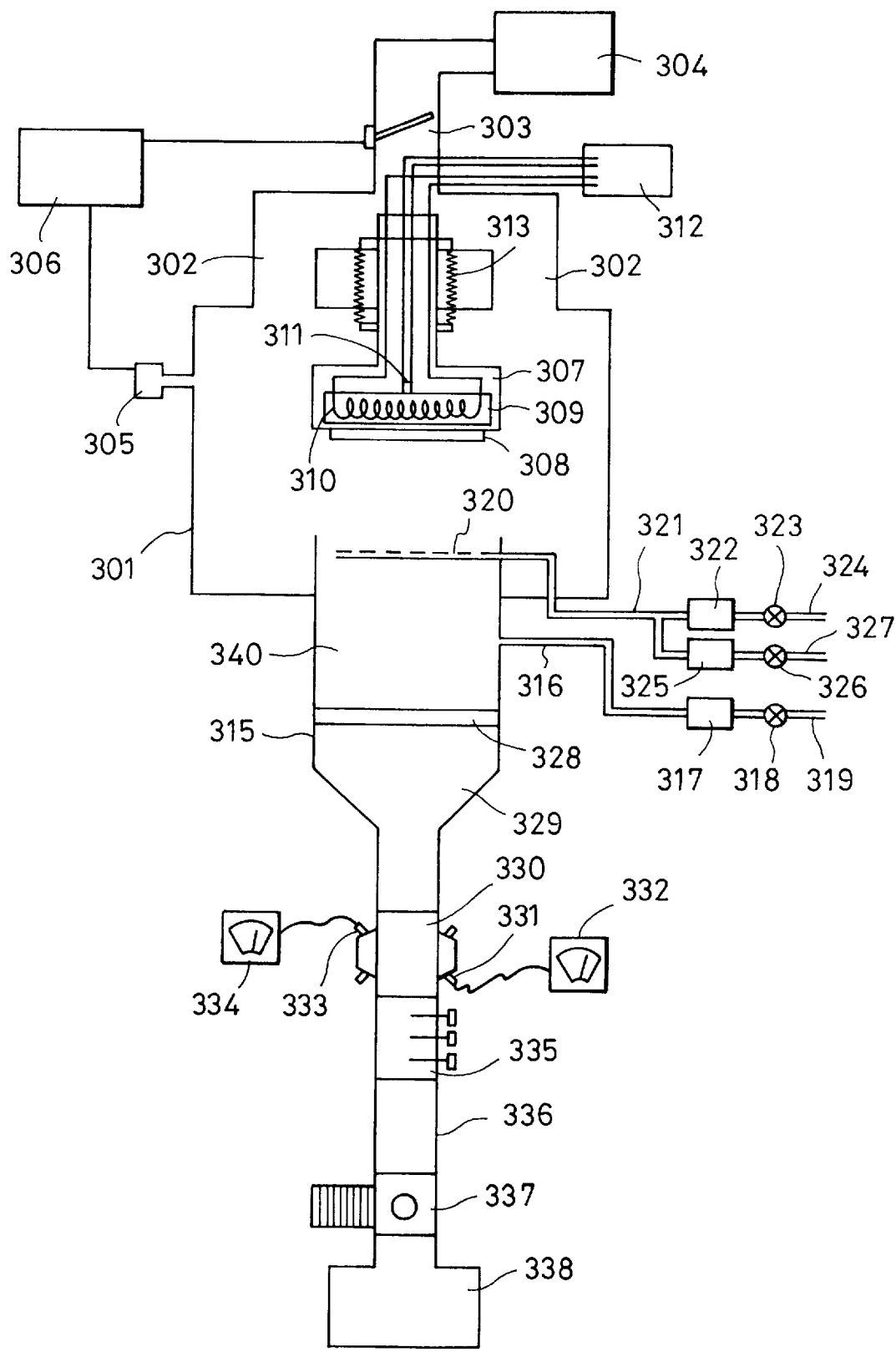

Although high-frequency energy is not applied to the deposition space according to the apparatus shown in FIG. 3, electrodes for applying high-frequency energy, e.g., RF, may be further provided in the deposition space, as is shown in FIG. 2, and an RF power source may be installed for the electrodes.

In the following embodiment, hydrogen gas, a material gas, and a doping gas are activated by any energy before introducing into a deposition space. The timing for introducing the three kinds of radicals will be described with reference to FIG. 4.

The hydrogen radicals from hydrogen gas, the material radicals, such as the $SiF_n$ radicals, from a material gas, and the dopant radicals from a doping gas are generated in separate spaces adjacent to a deposition space for film-forming. Only the hydrogen radicals are continuously supplied for the deposition space. In the following, the $SiF_n$ radicals are employed as the material radicals. Under this condition, the $SiF_n$ radicals are intermittently introduced into the deposition space. As a result, the film deposition proceeds during the introduction of the $SiF_n$ radicals, and the deposited film is treated with the hydrogen plasma and is structurally relaxed while the introduction of the $SiF_n$ radicals is stopped.

Meanwhile, when the dopant radicals are supplied with the $SiF_n$ radicals, the crystallinity of the resultant film decreases compared with that of the film obtained by not introducing the $SiF_n$ radicals with the dopant radicals. This phenomenon might be caused by the gas-phase reaction between the reaction products of the dopant radicals and the hydrogen radicals and the reaction products of the $SiF_n$ radicals and the hydrogen radicals. In this case, it is difficult to improve the crystallinity even if the hydrogen-plasma-treatment time-period per cycle is sufficiently long.

Figure 4:
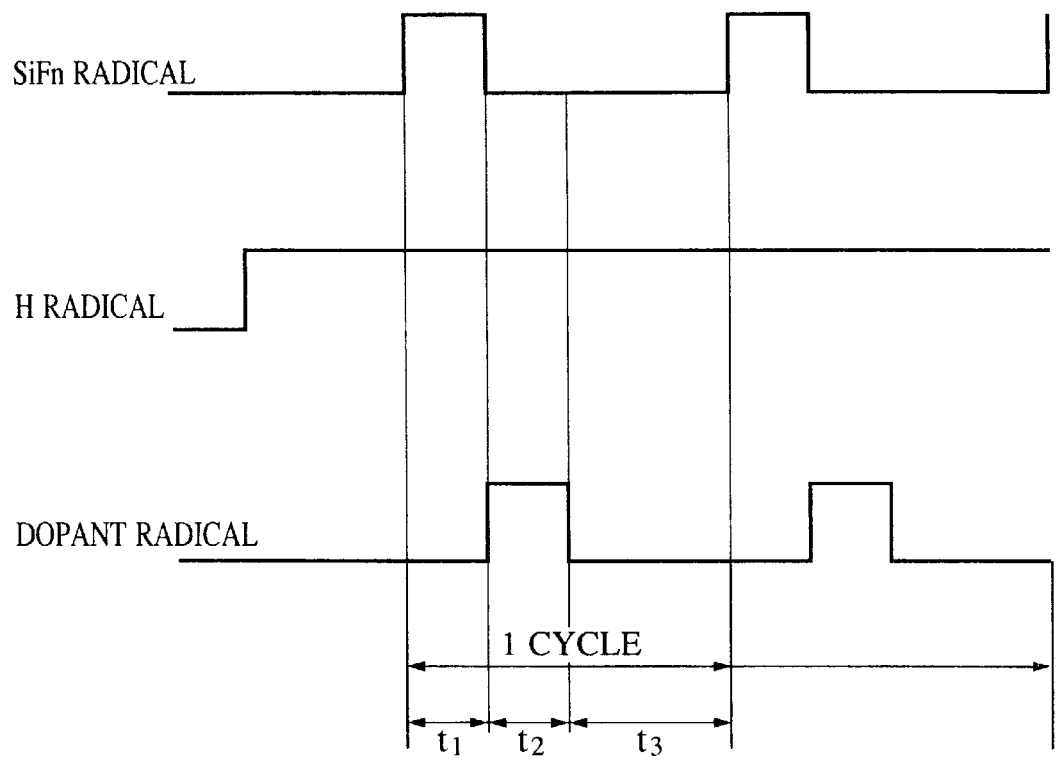
FIG. 4 is a schematic diagram explaining the timing for introducing radicals according to the present invention.

Therefore, the $SiF_n$ radicals and the dopant radicals are introduced at different times, without overlapping, as is shown in FIG. 4. In consequence, the gas-phase reaction between the decomposition products of the dopant radicals and those of the $SiF_n$ radicals can be suppressed, preventing decrease in crystallinity caused by introducing the dopant radicals.

A deposition apparatus preferably used for the above mentioned embodiment will be described as follows taken in conjunction with FIGS. 2 and 5. A vacuum chamber 501 for film-forming and an evacuation device 504 are connected through an evacuation conduit 502. On the way from the evacuation device 504 to the vacuum chamber 501, the evacuation conduit 502 branches into two conduits connecting to the vacuum chamber 501 so as to provide a uniform gas flow. A pressure controller 506 controls opening and closing of an electrically driven butterfly valve 503 set up in the evacuation conduit 502 to maintain a desired pressure according to signals from a pressure gauge 505.

A substrate 508 for deposition is placed on the surface of a supporting base 507. A heater block 509 having a heater 510 embedded therein is further provided for the supporting base 507. A thermo couple 511 is set up on the heater block 509 so as to determine the temperature thereof. The heater block 509 is adjusted to a predetermined temperature, which has been calibrated, by a temperature controller 512 so as to maintain the surface of the substrate 508 at a desired temperature.

Due to a bellows conduit 513, the supporting base 507 is vertically adjustable. The vacuum chamber 501 and the supporting base 507 are connected electrically.

The hydrogen gas is supplied from a gas introduction conduit 516 and excited by the microwave power, which power introduced from a microwave waveguide 515 through an alminium microwave window 514, so as to generate the plasma glow discharge, producing the hydrogen radicals.

A flow-controller 517 for controlling the hydrogen gas flow rate is connected to a hydrogen gas pressure controller (not shown in the figure) and a hydrogen gas bomb (not shown in the figure) by a gas conduit 519 via a valve 518.

The generated hydrogen radicals produce $SiF_1F_m$ radicals, which can deposit a film, by collision reaction with the $SiF_n$ radicals introduced through an introduction conduit 520 for material radicals (in this example, the $SiF_n$ radicals).

For generating the $SiF_n$ radicals, a microwave introduction space 521 includes a reaction conduit, i.e., another space adjacent to the deposition space, connecting to the introduction conduit 520 for the $SiF_n$ radicals. Silicon fluoride gas (the material gas) flowing in the reaction conduit is excited by microwave plasma and decomposed to generate the $SiF_n$ radicals. A flow-controller 522 for controlling the silicon fluoride gas flow rate is connected with a silicon fluoride gas pressure controller (not shown in the figure) and a silicon fluoride gas bomb (not shown in the figure) by a gas conduit 524 via a valve 523.

A microwave space 526 includes a reaction conduit, i.e., another space adjacent to the deposition space, for generating the dopant radicals by decomposing the doping gas. The generated dopant radicals are supplied for the deposition space through an introduction conduit 525 for dopant radicals. The dopant radicals are implanted as they are into lattices of a polycrystal Si film, if their reactivity is sufficiently high. In the case of low reactivity, the dopant radicals are reduced by colliding with the hydrogen radicals before implantation so as to increase their reactivity. A flow-controller 527 for controlling the doping gas flow rate is connected with a doping gas pressure controller (not shown in the figure) and a doping gas bomb (not shown in the figure) through a gas conduit 529 via a valve 528. In FIG. 5, there is shown an embodiment of a deposition apparatus having a pair of systems for introducing the dopant radicals and the material radicals.

A waveguide 530 for monitoring power is provided with a detector 531 for the power of the incident microwaves and a detector 533 for the power of the reflected microwaves. The detectors 533 and 531 are connected with corresponding meters 532 and 534 for monitoring the power of the incident microwaves and the reflected microwaves, respectively. An isolator 537, connecting to a wave guide 536, is provided for preventing the power of the reflected microwaves from reaching a microwave power source 538 which is used for hydrogen radical formation.

The introduction conduits 520 and 525 for the $SiF_n$ radicals and the dopant radicals, respectively, are arranged bilaterally symmetrically to uniformly diffuse the radicals on the substrate surface, i.e., to obtain a deposited film with a constant thickness. In some cases, each kind of radical may be introduced by one introduction conduit, however, it is desirable to employ other means for securing a constant thickness for a deposited film.

Although the apparatus of the present embodiment is provided with the introduction conduits 520 and 525 each for the $SiF_n$ radicals and the dopant radicals, only one introduction conduit may be employed because the material gas, such as the $SiF_n$ radicals, and the doping gas are introduced thereto at different time, without overlapping.

A tapered waveguide 539 is provided for connecting a microwave introduction window 514 with an ordinary square introduction conduit. A microwave matching device 535 has three stubs and is used for matching the microwave power supply system and the load. A space 540 is set up adjacent to the deposition space.

Material Gas

In the present invention, Si hydrides, Si halides, Si hydrogen-halides, and the like are used as a material gas. Practical examples of them are $SiH_4$, $Si_2H_6$, $Si_3H_8$, $SiF_4$, $Si_2F_6$, $SiCl_4$, $Si_2Cl_6$, $SiH_2Cl_2$, $SiH_2F_2$, $SiHCl_3$, and $SiHF_3$.

Doping Gas

In the present invention, such gas including an element of Group V of the periodic table is used as the doping gas for preparing an n-type Si film. Practical examples of the gas are $PH_3$, $PF_5$, $PF_3$, $ASH_3$, $ASF_3$, $ASF_5$, $PCl_3$, $PCl_5$, $AsCl_3$, $AsCl_5$, $C_4H_{11}P$, $C_4H_{11}As$, $P(CH_3)_5$, $P(C_2H_5)_5$, $As(CH_3)_5$, and $As(C_2H_5)_5$. In addition, such gas including an element of Group III of the periodic table is used as the doping gas for preparing a p-type Si film. Practical preferable examples of the gas are $BF_3$, $B_2H_5$, $Al(CH_3)_3$, $Al(C_2H_5)_3$, $BCl_3$, $BBr_3$, $B(CH_3)_3$, $B(C_2H_5)_3$, and $BC_4H_{11}$.

In the present invention, the preferred content of dopant including P, As, B, Al, in the polycrystal Si, is $10^{16}$ cm$^{-3}$ or more. The upper limit of the dopant content may be determined considering the characteristics and conductivity of the required film.

Silicon fluoride gas may be preferably used as the material gas in such a case that a material gas, hydrogen gas, and a doping gas are introduced into the deposition space after being activated to the radical condition. The radicals employed in the present invention will be described as follows.

$SiF_n$ Radicals

The $SiF_n$ radicals used in the present invention are quadrivalent silicon atoms, some of which bond with fluorine atoms. Since the electronegativity of the fluorine atoms are significantly high, the valence electrons of silicon atoms are attracted to the fluorine atoms, remarkably decreasing the radical reactivity. $SiF_4$ and $Si_2F_6$ are examples of the material gas for generating the $SiF_n$ radicals.

When a hydrogen radical collides with an $SiF_n$ radical, the reaction between the hydrogen radical and the fluorine atom is significantly strong because the hydrogen radical is highly reactive and gives an electron to the other at the time of reaction. Further, since the energy from the HF molecular reaction is high, the $SiF_n$ radical is excited to a high energy level when a HF molecule liberates from the $SiF_n$ radical. Moreover, the $SiF_n$ radical gains its reactivity by colliding with another hydrogen radical. In consequence, $SiF_lH_m$ radicals (1+m≦3) are produced and converted to radicals which can contribute to the film deposition. Since the film surface is formed with the $SIF_nH_m$ radicals deposited on the substrate, some fluorine atoms and hydrogen atoms are positioned on the film surface. When an $SiF_nH_m$ radical is provided on the film, the hydrogen atom and the fluorine atom of the $SiF_nH_m$ radical bond with a fluorine atom and a hydrogen atom of the film, respectively, and liberates from the film as a form of HF, leaving heat of formation on the Si lattice. Therefore, it is considered that a dense Si lattice structure is obtained.

As mentioned above, dangling bonds are not required when another $SIF_nH_m$ radical is provided on the surface of the substrate or the film. Thus, deposition of the film can proceed without removing hydrogen atoms or fluorine atoms from the film surface before the $SIF_nH_m$ radical reaches thereto. As a result, it is possible to prepare an excellent polycrystal film at a low temperature because of the following reasons:

(i) there is no defect caused by a dangling bond;
(ii) no energy is required for removing hydrogen atoms or fluorine atoms from the film surface; and
(iii) heat for formation is provided from the HF formation.

Dopant Radicals

The gases of the above mentioned two groups can be used as a doping gas for generating the dopant radicals according to the present invention.

When the dopant radicals generated from the doping gas and the $SiF_n$ radicals above are introduced into a deposition space for forming a film, it is difficult to obtain a dense Si lattice structure, since the following reactions occurs in the gas-phase simultaneously;

(i) the reaction between the dopant radicals and the hydrogen radicals;
(ii) the reaction between the $SiF_n$ radicals and the hydrogen radicals; and
(iii) the reaction between the reaction products of the reaction (ii) and those of the reaction (iii).

However, by introducing the $SiF_n$ radicals and the dopant radicals at different times into the deposition space, the gas-phase reaction between the $SiF_n$ radicals and the dopant radicals can be prevented, enabling to provide the dopant radicals on dense Si lattice structure. Therefore, the dopant atoms are implanted into the polycrystal Si film without the influence of the main structure of the four-coordinate Si.

Hydrogen Radicals

In accordance with the present invention, the hydrogen radicals have the following three roles;

(i) activation of the $SiF_n$ radicals;
(ii) activation of the dopant radicals; and
(iii) annealing and structural relaxation of the lattice of the film surface during deposition.

Since the roles (i) and (ii) were already mentioned above, the role (iii) will be described in the following.

Surface treatment with hydrogen radicals is employed as a post-treatment of the film deposition using the $SiF_n$ radicals and the hydrogen radicals or that of the dopant diffusion using the dopant radicals and the hydrogen radicals. It is possible while etching, to change an incompletely crystallized portion or an amorphous portion into a complete crystalline structure by the hydrogen radical surface treatment.

In such a case, the penetrating distance of the hydrogen radicals determines the thickness of the Si layer in which structural change occurs. In general, the thickness is approximately 5 nm through 50 nm, depending on the energy of the hydrogen radicals. Therefore, the desired film thickness obtained per cycle is approximately from 5 nm through 100 nm, preferably 5 nm to 50 nm. A certain duration of the hydrogen radical treatment, i.e., 5 seconds or more in general, is required to induce change of film structure. However, if the duration is too long, the film surface tends to be nonuniform, resulting decrease in crystallinity. Further, it is necessary to set up the duration while considering the film forming efficiency. Consequently, the desired duration of the hydrogen treatment is less than 90 seconds in general, preferably less than 50 seconds, and more preferably less than 30 seconds.

Example 1

In accordance with example 1, a phosphorus-doped polycrystal film was deposited on a glass substrate by the deposition apparatus shown in FIG. 2, while a material gas and a doping gas were introduced at different times into the deposition space as indicated in FIG. 1.

The following are the steps for preparing polycrystal Si film.

1) A sodium-free glass was attached to the anode 7 after being washed by organic solvents, acetone and isopropyl alcohol. The vacuum chamber 1 was evacuated to $3 \times 10^{-6}$ Torr or less. The surface of the substrate 8 was adjusted to 350° C.

2) 15 sccm of hydrogen gas was introduced from the gas introduction conduit 14 via the flow-controller 17. The pressure of the vacuum chamber 1 was adjusted to 100 mTorr by a pressure controller (not shown in the figure).

3) After a pressure of 100 mTorr was established in the vacuum chamber 1, 100 W of RF power was applied thereto such that glow charge plasma was generated between the cathode 2 and the anode 7 by the hydrogen gas. The next film-forming step was started after the discharge reached a stable condition.

4) The film-forming step comprised the following processes (i), (ii), and (iii). To obtain a phosphorus-doped polycrystal Si film, the processes (i), (ii), and (iii) were repeated 360 times in that order.

(i) 100 sccm of $SiF_4$ gas was used as the material gas, and was introduced through the gas introduction conduit 13 into the vacuum chamber 1 for 10 seconds to deposit a polycrystal Si film.

(ii) $PH_3$ gas used as the doping gas was diluted to 2% in hydrogen gas. After stopping the introduction of the material gas, 1 sccm of the diluted $PH_3$ gas was introduced into the vacuum chamber 1 through the gas introduction conduit 15 for 10 seconds to dope the deposited film with phosphorus.

(iii) After stopping the introduction of the doping gas, the hydrogen gas alone was introduced into the vacuum chamber 1 for 30 seconds so as to treat the surface of the deposited film by the hydrogen plasma.

The flow rate of the hydrogen gas and the applied RF power did not change through the processes (i) to (iii).

5) After the completion of the deposition, the substrate was cooled to room temperature and the sample produced from the above steps 1) to 4) was taken out from the vacuum chamber 1.

Comparative Example 1

In the comparative example 1, a polycrystal film was produced in the same manner as example 1, except that the process (ii) of the film-forming step was omitted and the rest of the processes (i) and (iii) were repeated 360 times in that order to deposit a polycrystal Si film which was not doped with phosphorus.

Comparative Example 2

In the comparative example 2, a polycrystal film was produced in the same manner as example 1, except that the following process (iv) was employed for the film-forming step instead of the process (i) and (ii). In other words, according to comparative example 2, the material gas and the doping gas were introduced at the same time into the deposition space, while these gases were introduced at different times in example 1. Thus, the film-forming step proceeded such that the processes (iv) and (iii) were repeated 360 times in that order for depositing a polycrystal Si film doped with phosphorus.

(iv) 100 sccm of $PH_3$ gas was diluted to 2% in hydrogen gas. $SiF_4$ gas and 1 sccm of the diluted $PH_3$ gas were introduced at the same time into the vacuum chamber 1 through the gas introduction conduits 13 and 15, respectively. The introduction was carried out for 10 seconds so as to deposit a polycrystal Si film while doping the film with phosphorus.

The crystallinity of the samples prepared from example 1, comparative example 1, and comparative example 2 was evaluated by the X-ray diffractometry and the conductivity of them was also evaluated by a so-called four-points probe method. The thickness of those samples ranged from 850 nm to 900 nm.

Before explaining the results, the evaluation methods for crystallinity and conductivity will be described.

Evaluation of the Crystallinity

Although there are some methods for evaluating the crystallinity, the X-ray diffractometry and Raman spectrometry were employed for the present invention.

The X-ray diffraction intensity was measured for (220), (111), and (311) of Si.

Raman spectrometry was used for investigating the relation between the results from the X-ray diffractometry and the actual crystalline structure of the samples. A device equipped with an $Ar^+$ laser source was used for Raman spectrometry. The crystallinity was estimated from the integrated intensity ratio, a ratio between a sharp peak based on crystalline Si at around 520 $cm^{-1}$ and a broad peak based on amorphous Si at around 480 $cm^{-1}$, obtained by Raman spectrometry.

From the results of a crystalline Si wafer, it was identified that the sharp peak at around 520 $cm^{-1}$ was based on crystalline Si. Similarly, it was also identified that the broad peak at around 480 $cm^{-1}$ was based on amorphous Si from the results of an amorphous Si film prepared by a conventionally glow discharge plasma technique using $SiH_4$ gas. In addition, the structure of the crystalline Si wafer and the amorphous Si film were confirmed by the electron beam diffractometry.

Concerning the sample prepared by the deposition method of the present invention, the X-ray diffraction intensity of (220) of Si became larger, with the increase in crystallinity. Moreover, when the thickness of the sample ranged from 700 nm to 900 nm and the X-ray diffraction intensity of (220) of Si exceeded 300 counts/second (hereinafter referred to as cps), it was impossible for the Raman spectrometry to detect the broad peak based on amorphous Si at around 480 $cm^{-1}$. From these results, the samples exhibiting X-ray diffraction intensities of 300 cps or more were considered to be crystallized to approximately 100%.

Therefore, considering the crystallinity, a sample polycrystal Si film whose thickness ranged from 700 nm to 900 nm was regarded to be desirable when their diffraction intensity of (220) of Si was 300 cps or more.

Evaluation of the Conductivity

According to the present invention, the conductivity was determined by a so-called four-points probe method. The contents of phosphorus and bromine trapped into the sample Si films were determined by an SIMS (secondary ion mass spectrometer) and the obtained values were regarded as almost the same, i.e., from $1 \times 10^{19}$ to $2 \times 10^{19}$ $cm^{-3}$.

The highest conductivity of the amorphous Si film prepared by a conventionally glow discharge plasma technique using $SiH_4$ gas was 2 S/cm for the n-type phosphorus-doped sample and $2 \times 10^{-3}$ S/cm for the p-type bromine-doped sample.

Therefore, in the present invention, the conductivity of the n-type phosphorus-doped polycrystal Si films was considered to be high when it was 2 S/cm or more. Similarly, the conductivity of the p-type bromine-doped polycrystal Si films was considered to be high when it was $2 \times 10^{-3}$ S/cm or more.

The results of the crystallinity and conductivity obtained from the above example and comparative examples will be explained in the following.

(1) Results of the crystallinity by the X-ray diffractometry

Table 1 shows the results of the samples. The samples of example 1 and comparative example 1 indicate remarkably strong peaks at (220) and weak peaks at (111) and (311). Meanwhile, only a weak peak at (220) is observed for the sample of comparative example 2, which peak is almost obscure by the background. From these results, it is found that a significantly excellent films were obtained from example 1, in which the material gas and the doping gas were introduced at different times, and from comparative example 1 in which the doping gas was not introduced at all. It is also understood that the crystallinity of a film extremely decreased when the film was produced according to comparative example 2 in which the material gas and the doping gas were introduced at the same time into the deposition space.

That is, when a film was obtained by repeating processes such that the material gas and the doping gas were introduced at different times into the deposition chamber, followed by hydrogen plasma treatment to the film (example 1), the crystallinity of the resulting film was not different from a film produced without doping (comparative example 1).

TABLE 1

| | X-ray diffraction intensity (cps) | | |
|---|---|---|---|
| | (220) | (111) | (311) |
| Example 1 | 4000 | | |
| Comparative example 1 | 4500 | | |
| Comparative example 2 | 5 | 0 | 0 |

(2) Results of the conductivity measured by the four-points probe method

Table 2 shows the results of the samples. From Table 2, it is understood that the sample of the example 1 has not only increased crystallinity but also higher conductivity compared with those of comparative example 1 and 2.

TABLE 2

| Conductivity | Gas introduction (material gas and doping gas) | P dopant | (S/cm) |
|---|---|---|---|
| Example 1 | at different times | used | 40 |
| Comparative example 1 | only material gas | not used | $2 \times 10^{-7}$ |
| Comparative example 2 | at the same time | used | $3 \times 10^{-1}$ |

Example 2

According to the example 2, a polycrystal film was produced in the same manner as example 1, except that the time-period for the hydrogen plasma treatment was varied and set up to 0, 5, 10, 30, 60, 90, and 120 seconds per cycle.

Figure 6:
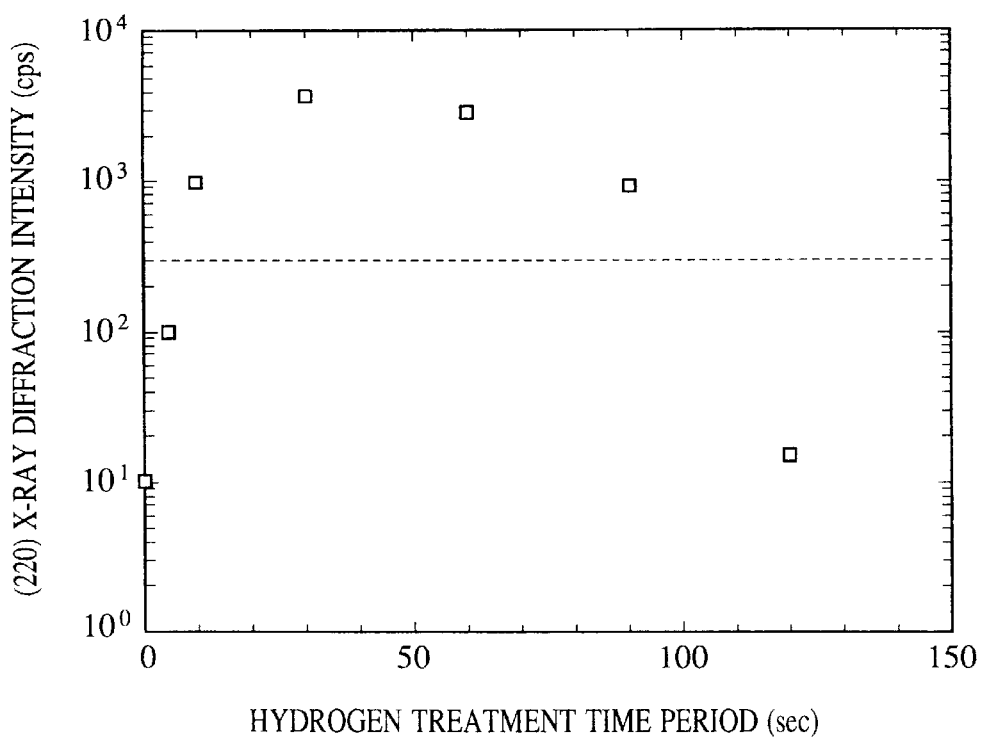
FIGS. 6, 8, and 10 are graphical representations showing the results of crystallinity obtained from the X-ray diffractometry.
Figure 7:
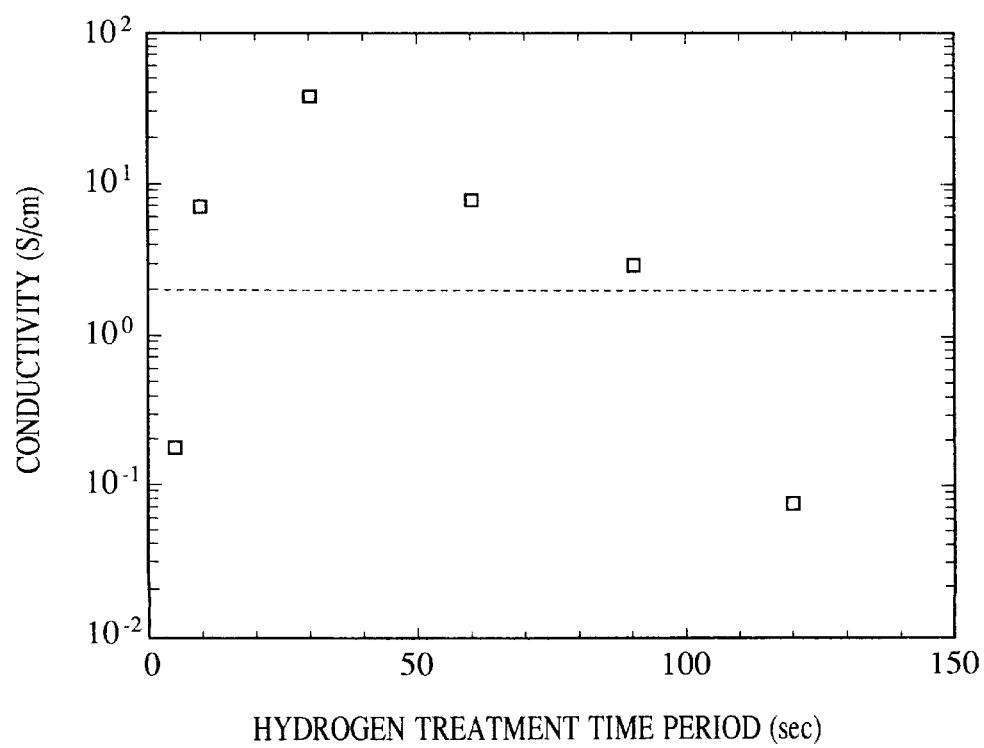
FIGS. 7, 9, and 11 are graphical representations indicating results of conductivity.

FIG. 6 shows the results of the crystallinity determined by the X-ray diffractometry and FIG. 7 indicates those of the conductivity measured by the four-points probe method. It is understood from FIG. 7 that the time-period for the hydrogen plasma treatment per cycle is from 10 to 90 seconds to obtain a polycrystal Si film whose conductivity is 2 S/cm or more.

Example 3

According to example 3, a polycrystal film was produced in the same manner as example 1, except that $BF_3$ gas diluted to 2% in hydrogen gas was employed as the doping gas.

Comparative Example 3

According to comparative example 3, a polycrystal film was produced in the same manner as comparative example 2, except that 15 sccm of $BF_3$ gas diluted to 2% in hydrogen gas was employed as the doping gas.

The results of the crystallinity and conductivity obtained from example 3 and comparative example 3 will be explained in the following. The crystallinity was determined by the X-ray diffractometry and the conductivity was measured by the four-points probe method. The thickness of the samples were 880 nm for example 3 and 870 nm for comparative example 3.

The sample of example 3 indicates a remarkably strong peak of 1200 cps at (220) and is confirmed to be an excellent polycrystal Si film. Meanwhile, no peak is observed for the sample of comparative example 3.

The conductivity is 1.1 S/cm for the sample of example 3 and $5 \times 10^{-5}$ S/cm for the sample of comparative example 3.

Example 4

In accordance with example 4, a phosphorus-doped polycrystal film was produced in the same manner as example 1, except that $SiH_4$ was employed as the material gas.

The following are the steps for preparing polycrystal Si film.

1) A sodium-free glass was attached to the anode 7 after being washed by organic solvents, acetone and isopropyl alcohol. The vacuum chamber 1 was evacuated to $3 \times 10^{-6}$ Torr or less. The surface of the substrate 8 was adjusted to 450° C.

2) 200 sccm of hydrogen gas was introduced from the gas introduction conduit 14 via the flow-controller 17. The pressure of the vacuum chamber 1 was adjusted to 100 mTorr by a pressure controller (not shown in the figure).

3) After a pressure of 100 mTorr was established in the vacuum chamber 1, 120 W of RF power was applied thereto such that glow charge plasma was generated between the cathode 2 and the anode 7 by the hydrogen gas. The next film-forming step was started after the discharge reached a stable condition.

4) The film-forming step comprised the following processes (i), (ii), and (iii). To obtain a phosphorus-doped polycrystal Si film, the processes (i), (ii), and (iii) were repeated 600 times in that order.

(i) 20 sccm of $SiH_4$ gas was used as the material gas, and introduced through the gas introduction conduit 13 into the vacuum chamber 1 for 10 seconds to deposit a polycrystal Si film.

(ii) $PE_3$ gas used as the doping gas was diluted to 2% in hydrogen gas. After stopping the introduction of the material gas, 0.2 sccm of the diluted $PH_3$ gas was introduced into the vacuum chamber 1 through the gas introduction conduit 15 for 10 seconds to dope the deposited film with phosphorus.

(iii) The hydrogen gas alone was introduced into the vacuum chamber 1 for 30 seconds so as to treat the surface of the deposited film by the hydrogen plasma.

The flow rate of the hydrogen gas and the applied RF power did not change through the processes (i) to (iii).

5) After the completion of the deposition, the substrate was cooled to room temperature and the sample produced from the above steps 1) to 4) was taken out from the vacuum chamber 1.

Comparative Example 4

In comparative example 4, a polycrystal film was produced in the same manner as example 4, except that the following process (iv) was employed for the film-forming step instead of the process (i) and (ii). In other words, according to comparative example 4, the material gas and the doping gas were introduced at the same time into the deposition space, while these gases were introduced at different times in example 4. Thus, the film-forming step proceeded such that the processes (iv) and (iii) were repeated 150 times in that order for depositing a polycrystal Si film doped with phosphorus.

(iv) $PH_3$ gas was diluted to 2% in hydrogen gas. 20 sccm of $SiH_4$ gas and 0.2 sccm of the diluted $PH_3$ gas were introduced at the same time into the vacuum chamber 1 through the gas introduction conduits 13 and 15, respectively. The introduction was carried out for 10 seconds so as to deposit a polycrystal Si film while doping the film with phosphorus.

The crystallinity of the samples prepared from example 4 and comparative example 4 was evaluated by the X-ray diffractometry and the conductivity of them was also evaluated by the four-points probe method. The thickness of the sample films was 820 nm for example 4 and 830 nm for comparative example 4.

With respect to the pattern of the X-ray diffraction, the samples of example 4 indicates remarkably strong peak of 980 cps at (220) and weak peaks at (111) and (311). Meanwhile, any peak stronger than the background is observed for the sample of comparative example 4. From these results, it is found that the sample of example 4 has better crystallinity compared with that of the sample of comparative example 4.

The conductivity of the samples is 3 S/cm for example 4 and $9 \times 10^{-1}$ S/cm for comparative example 4. From the results, it is found that the sample of example 4 has not only excellent crystallinity but also higher conductivity compared with comparative example 4.

Example 5

In accordance with example 5, a phosphorus-doped polycrystal film was deposited on a glass substrate by the deposition apparatus shown in FIG. 3, while a material gas and a doping gas were introduced at different times into the deposition space as indicated in FIG. 1. During the film-forming time-period, hydrogen gas was activated and introduced into the deposition space.

The following are the steps for preparing polycrystal Si film.

1) A sodium-free glass was attached to the supporting base 307 after being washed by organic solvents, acetone and isopropyl alcohol. The vacuum chamber 1 was evacuated to $3 \times 10^{-6}$ Torr or less by the evacuation device 301. The surface of the substrate 308 was adjusted to 350° C. by a heater.
2) 15 sccm of hydrogen gas was introduced from the gas introduction conduit 316 via the flow-controller 317. The pressure of the vacuum chamber 301 was adjusted to 400 mTorr by a pressure controller (not shown in the figure).
3) After a pressure of 400 mTorr was established in the vacuum chamber 301, 400 W of the microwave power was applied thereto such that glow charge plasma was generated by the hydrogen gas. The next film-forming step was started after the discharge reached a stable condition.
4) The film-forming step comprised the following processes (i), (ii), and (iii). To obtain a phosphorus-doped polycrystal Si film, the processes (i), (ii), and (iii) were repeated 90 times in that order. During the film-forming time-period, the hydrogen gas was continuously introduced, and the hydrogen radicals were supplied at all times to the vacuum chamber 301.
   (i) 100 sccm of $SiF_4$ gas was used as the material gas, and introduced by the gas blowing conduit 320 into the vacuum chamber 301 for 10 seconds to deposit a polycrystal Si film.
   (ii) $PH_3$ gas used as the doping gas was diluted to 2% in hydrogen gas. After stopping the introduction of the material gas, 1 sccm of the diluted $PH_3$ gas was introduced into the vacuum chamber 1 by the gas blowing conduit 320 for 10 seconds to dope the deposited film with phosphorus.
   (iii) After stopping the introduction of the doping gas, the hydrogen gas alone was introduced into the vacuum chamber 301 for 10 seconds so as to treat the surface of the deposited film by the hydrogen plasma.

The flow rate of the hydrogen gas and the applied microwave power did not change through the processes (i) to (iii).

5) After the completion of the deposition, the substrate was cooled to room temperature and the sample produced from the above steps 1) to 4) was taken out from the vacuum chamber 301.

Comparative Example 5

In comparative example 5, a polycrystal film was produced in the same manner as example 5, except that the process (ii) of the film-forming step was omitted and the rest of the processes (i) and (iii) were repeated 90 times in that order to deposit a polycrystal Si film which was not doped with phosphorus.

Comparative Example 6

In comparative example 6, a polycrystal film was produced in the same manner as example 5, except that the following process (iv) was employed for the film-forming step instead of the process (i) and (ii). In other words, according to comparative example 6, the material gas and the doping gas were introduced at the same time into the deposition space, while these gases were introduced at different times in example 5. Thus, the film-forming step proceeded such that the processes (iv) and (iii) were repeated 90 times in that order for depositing a polycrystal Si film doped with phosphorus.

(iv) $PH_3$ gas was diluted to 2% in hydrogen gas. 100 sccm of $SiF_4$ gas and 1 sccm of the diluted $PH_3$ gas were introduced at the same time into the vacuum chamber 301 through the gas blowing conduits 320. The introduction was carried out for 10 seconds so as to deposit a polycrystal Si film while doping the film with phosphorus.

The crystallinity of the samples prepared from example 5, comparative example 5, and comparative example 6 was evaluated by the X-ray diffractometry and the conductivity of them was also evaluated by the four-points probe method. The thickness of those samples ranged from 750 nm to 800 nm.

(1) Results of the crystallinity by the X-ray diffractometry

Table 3 shows the results of the samples. The samples of example 5 and comparative example 5 indicate remarkably strong peaks at (220) and weak peaks at (111) and (311). Meanwhile, only a weak peak at (220) is observed for the sample of comparative example 6, which peak is almost obscure by the background. From these results, it is found that a significantly excellent films were obtained from example 5, in which the material gas and the doping gas were introduced at different times, and from comparative example 5 in which the doping gas was not introduced at all. It is also understood that the crystallinity of a film extremely decreases when the film was produced according to comparative example 6 in which the material gas and the doping gas were introduced at the same time into the deposition space.

That is, when a film was obtained by repeating processes such that the material gas and the doping gas were introduced at different times into the deposition chamber, followed by hydrogen plasma treatment to the film (example 5), the crystallinity of the resulting film was not different from a film produced without doping (comparative example 5).

TABLE 3

| | X-ray diffraction intensity (cps) | | |
|---|---|---|---|
| | (220) | (111) | (311) |
| Example 5 | 3500 | | |
| Comparative example 5 | 4000 | | |
| Comparative example 6 | 5 | 0 | 0 |

(2) Results of the conductivity measured by the four-points probe method

Table 4 shows the results of the samples. It is understood that the sample of example 5 has not only increased crystallinity but also higher conductivity compared with those of comparative example 5 and 6.

TABLE 4

| Conductivity | Gas introduction (material gas and doping gas) | P dopant | (S/cm) |
|---|---|---|---|
| Example 5 | at different times | used | 30 |
| Comparative example 5 | only material gas | not used | $3 \times 10^{-7}$ |
| Comparative example 6 | at the same time | used | $2 \times 10^{-1}$ |

Example 6

According to example 6, a polycrystal film was produced in the same manner as example 5, except that the time-period for the hydrogen plasma treatment was varied and set up to 0, 5, 10, 20, 30, 50 and 60 seconds per cycle. The thickness of the samples ranged from 700 nm to 800 nm.

Figure 8:
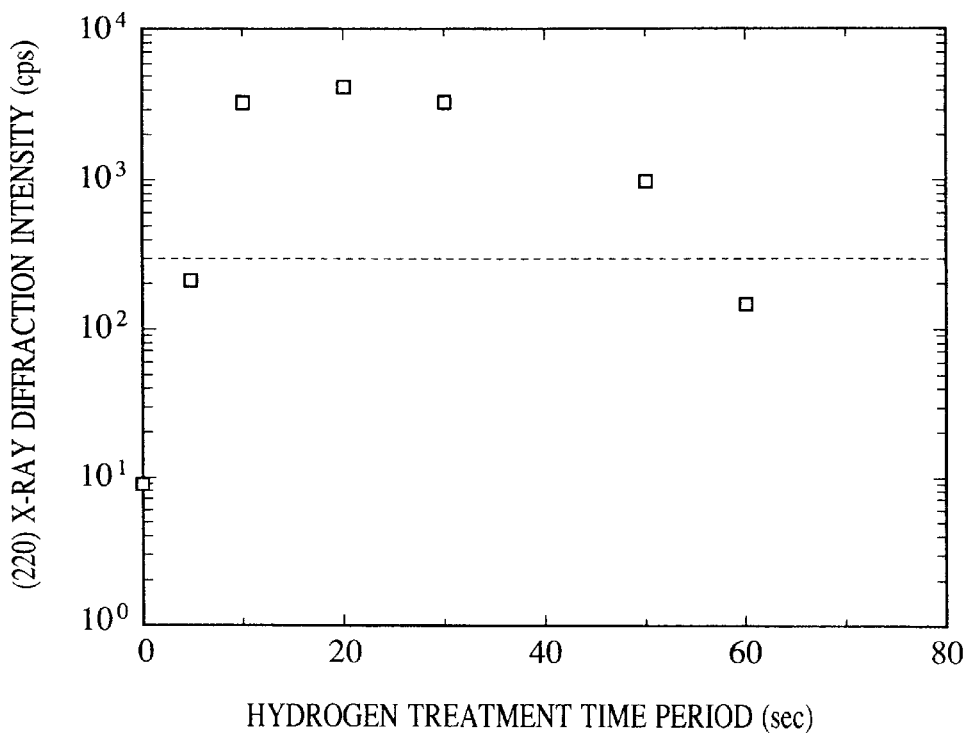
Figure 9:
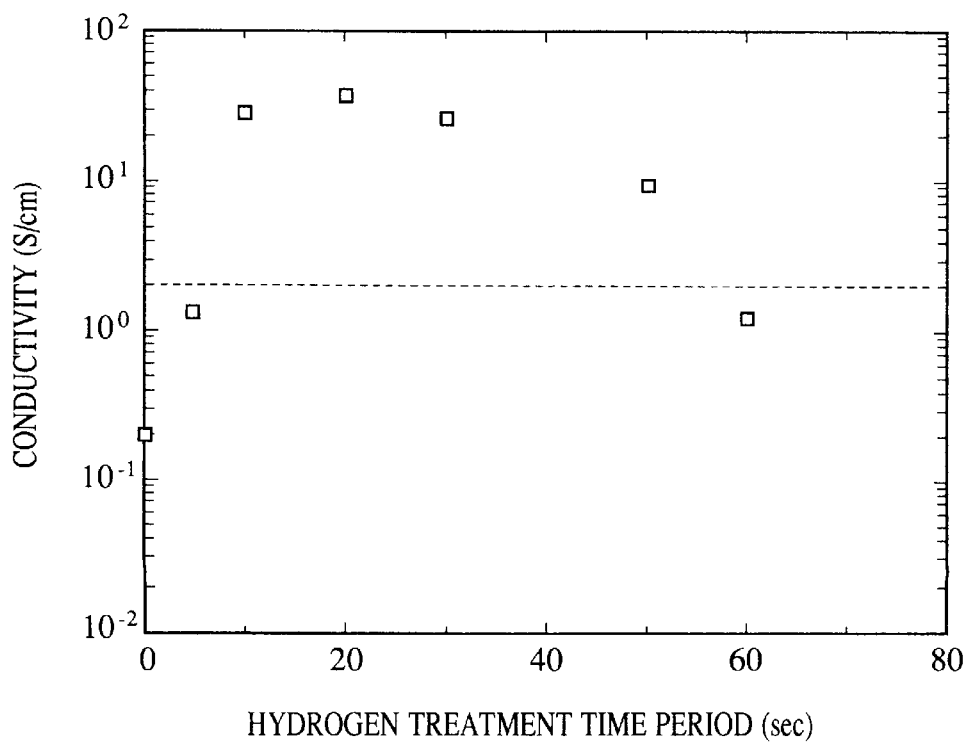

FIG. 8 shows the results of the crystallinity determined by the X-ray diffractometry and FIG. 9 indicates those of the conductivity measured by the four-points probe method. It is understood from FIG. 9 that to obtain a polycrystal Si film whose conductivity is 2 S/cm or more, the time-period for the hydrogen plasma treatment per cycle is from 10 to 50 seconds.

Example 7

According to example 7, a polycrystal film was produced in the same manner as example 5, except that 15 sccm of $BF_3$ gas diluted to 2% in hydrogen gas was employed as the doping gas.

Comparative Example 7

According to comparative example 7, a polycrystal film was produced in the same manner as comparative example 6, except that 15 sccm of $BF_3$ gas diluted to 2% in hydrogen gas was employed as the doping gas.

The results of the crystallinity and conductivity obtained from example 7 and comparative example 7 will be explained in the following. The crystallinity was determined by the X-ray diffractometry and the conductivity was measured by the four-points probe method. The thickness of the samples were 730 nm for example 7 and 720 nm for comparative example 7.

The sample of example 7 indicates a remarkably high peak of 1200 cps at (220) and is confirmed to be an excellent polycrystal Si film. Meanwhile, no peak is observed for the sample of comparative example 7.

The conductivity is 1.8 S/cm for the sample of example 7 and $6 \times 10^{-5}$ S/cm for the sample of comparative example 7.

Example 8

In accordance with example 8, a phosphorus-doped polycrystal film was produced in the same manner as example 5, except that $SiH_4$ was employed as the material gas. The following are the steps for preparing a polycrystal Si film.

1) A sodium-free glass was attached to the supporting base 307 after being washed by organic solvents, acetone and isopropyl alcohol. The vacuum chamber 1 was evacuated to $3 \times 10^{-6}$ Torr or less by the evacuation device. The surface of the substrate 308 was adjusted to 450° C. by a heater.

2) 300 sccm of hydrogen gas was introduced from the gas introduction conduit 314 via the flow-controller 317. The pressure of the vacuum chamber 301 was adjusted to 100 mTorr by a pressure controller (not shown in the figure).

3) After a pressure of 100 mTorr was established in the vacuum chamber 301, 500 W of the microwave power was applied thereto such that glow charge plasma was generated by the hydrogen gas. The next film-forming step was started after the discharge reached a stable condition.

4) The film-forming step comprised the following processes (i), (ii), and (iii). To obtain a phosphorus-doped polycrystal Si film, the processes (i), (ii), and (iii) were repeated 150 times in that order. During the film-forming time-period, the hydrogen gas was continuously introduced and the hydrogen radicals were supplied at all times to the deposition space.

(i) 20 sccm of $SiH_4$ gas was used as the material gas, and introduced by the gas blowing conduit 320 into the vacuum chamber 301 for 10 seconds to deposit a polycrystal Si film.

(ii) $PH_3$ gas used as the doping gas was diluted to 2% in hydrogen gas. After stopping the introduction of the material gas, 0.2 sccm of the diluted $PH_3$ gas was introduced into the vacuum chamber 301 by the gas blowing conduit 320 for 10 seconds to dope the deposited film with phosphorus.

(iii) The hydrogen gas alone was introduced into the vacuum chamber 301 for 30 seconds so as to treat the surface of the deposited film by the hydrogen plasma.

The flow rate of the hydrogen gas and the applied microwave power did not change through the processes (i) to (iii).

5) After the completion of the deposition, the substrate was cooled to room temperature and the sample produced from the above steps 1) to 4) was taken out from the vacuum chamber 1.

Comparative Example 8

In the comparative example 8, a polycrystal film was produced in the same manner as example 8, except that the following process (iv) was employed for the film-forming step instead of the process (i) and (ii). In other words, according to comparative example 8, the material gas and the doping gas were introduced at the same time into the deposition space, while these gases were introduced at different times in example 8. Thus, the film-forming step proceeded such that the processes (iv) and (iii) were repeated 150 times in that order for depositing a polycrystal Si film doped with phosphorus.

(iv) $PH_3$ gas was diluted to 2% in hydrogen gas. 20 sccm of $SiH_4$ gas and 0.2 sccm of the diluted $PH_3$ gas were introduced at the same time into the vacuum chamber 301 through the gas blowing conduit 320. The introduction was carried out for 10 seconds so as to deposit a polycrystal Si film while doping the film with phosphorus.

The crystallinity of the samples prepared from example 8 and comparative example 8 was evaluated by the X-ray diffractometry and the conductivity of them was also evaluated by the four-points probe method. The thickness of the samples was 750 nm for example 8 and 740 nm for comparative example 8.

With respect to the pattern of the X-ray diffraction, the samples of example 8 indicates remarkably strong peak of 1050 cps at (220) and weak peaks at (111) and (311). Meanwhile, any peak stronger than the background is observed for the sample of comparative example 8 . From these results, it is found that the sample of example 8 has better crystallinity compared with that of the sample of comparative example 8.

The conductivity is 2.8 S/cm for the sample of example 8 and $8 \times 10^{-1}$ S/cm for the sample of comparative example 8. From the results, it is found that the sample of example 8 has not only excellent crystallinity but also higher conductivity compared with comparative example 8.

Example 9

Figure 5:
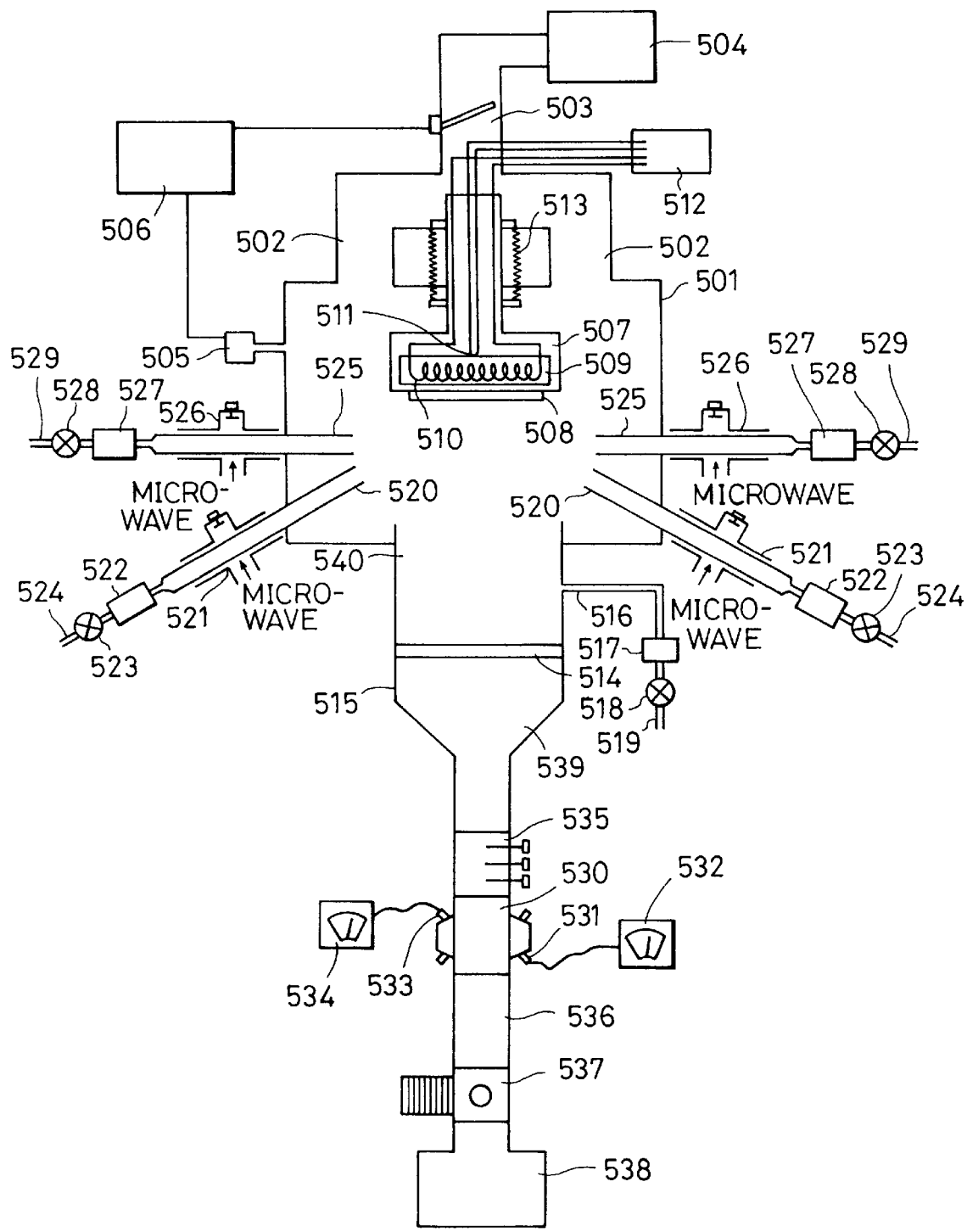

In accordance with example 9, a phosphorus-doped polycrystal film was deposited on a glass substrate by the deposition apparatus shown in FIG. 5, while hydrogen gas, a material gas and a doping gas were supplied to the deposition space after being activated. The $SiF_n$ radicals and the dopant radicals were introduced at different times therein as indicated in FIG. 4.

The following are the steps for preparing polycrystal Si film.

1) A sodium-free glass was attached to the supporting base 507 after being washed by organic solvents, acetone and isopropyl alcohol. The vacuum chamber 501 was evacuated to $3 \times 10^{-6}$ Torr or less by the evacuation device 501. The surface of the substrate 508 was adjusted to 350° C. by the heater.

2) 15 sccm of hydrogen gas was introduced from the gas introduction conduit 516 via the flow-controller 517. The pressure of the vacuum chamber 501 was adjusted to 400 mTorr by a pressure controller (not shown in the figure).

3) After a pressure of 400 mTorr was established in the vacuum chamber 501, 400 W of the microwave power was applied thereto such that glow charge plasma was generated in the space 540 by the hydrogen gas. The next film-forming step was started after the discharge reached a stable condition.

4) The film-forming step comprised the following processes (i), (ii), and (iii). To obtain a phosphorus-doped polycrystal Si film, the processes (i), (ii), and (iii) were repeated 60 times in that order. During the film-forming time-period, the hydrogen gas was continuously introduced and the hydrogen radicals were supplied at all times to the vacuum chamber 501. (i)
   100 sccm of $SiF_4$ gas was used as the material gas and introduced into the introduction conduit 520 for the $SiF_n$ radicals, then 100 W of the microwave power was applied thereto. The resultant $SiF_n$ radicals were supplied to the vacuum chamber 501 for 10 seconds to deposit a polycrystal Si film.
   (ii) $PF_5$ gas used as the doping gas was diluted to 2% in He gas. 1 sccm of the diluted $PF_5$ gas was introduced into the introduction conduit 525 for the doping radical, then 100 W of the microwave power was applied thereto. With the hydrogen radicals, the resultant dopant radicals were supplied to the vacuum chamber 501 for 10 seconds to dope the deposited film with phosphorus.
   (iii) After stopping the introduction of the dopant radicals, the hydrogen radicals alone were introduced into the vacuum chamber 501 for 10 seconds so as to treat the surface of the deposited film by the hydrogen plasma.

The flow rate of the hydrogen gas and the applied microwave power did not change through the processes (i) to (iii). In addition, while the $SiF_4$ gas and the doping gas were not introduced, the microwave power used for decomposing them was discontinued.

5) After the completion of the deposition, the substrate was cooled to room temperature and the sample produced from the above steps 1) to 4) was taken out from the vacuum chamber 501.

Comparative Example 9

In comparative example 9, a polycrystal film was produced in the same manner as example 9, except that the process (ii) of the film-forming step was omitted and the rest of the processes (i) and (iii) were repeated 90 times in that order to deposit a polycrystal Si film which was not doped with phosphorus.

Comparative Example 10

In comparative example 10, a polycrystal film was produced in the same manner as example 9, except that the following process (iv) was employed for the film-forming step instead of the process (i) and (ii). In other words, according to comparative example 10, the $SiF_n$ radicals and the dopant radicals were introduced at the same time into the deposition space, while they were introduced at different times in example 9. Thus, the film-forming step proceeded such that the processes (iv) and (iii) were repeated 60 times in that order for depositing a polycrystal Si film doped with phosphorus.
   (iv) 100 sccm of $SiF_4$ gas was introduced into the introduction conduit 520 for the $SiF_n$ radicals, then 100 W of the microwave power was applied thereto. The resultant $SiF_n$ radicals were supplied to the vacuum chamber 501 for 10 seconds. At the same time, 1 sccm of $PF_5$ gas diluted to 2% in He gas was introduced into the introduction conduit 525 for the doping radical, and 100 W of the microwave power was applied thereto, then the resultant dopant radicals were supplied to the vacuum chamber 501 for 10 seconds.

The crystallinity of the samples prepared from example 9, comparative example 9, and comparative example 10 was evaluated by the X-ray diffractometry and the conductivity of them was also evaluated by the four-points probe method. The thickness of those samples ranged from 800 nm to 900 nm.

(1) Results of the crystallinity by the X-ray diffractometry
   Table 5 shows the results of the samples. The samples of example 9 and comparative example 9 indicate remarkably strong peaks at (220) and weak peaks at (111) and (311). Meanwhile, only a weak peak at (220) is observed for the sample of comparative example 10, which peak is almost obscure by the background. From these results, it is found that significantly excellent films were obtained from example 9, in which the material radicals and the dopant radicals were introduced at different times, and from comparative example 9 in which the dopant radicals were not introduced at all. It is also understood that the crystallinity of a film extremely decreases when the film was produced according to comparative example 10 in which the $SiF_n$ radicals and the dopant radicals were introduced at the same time into the deposition space.

That is, when a film was obtained by repeating processes such that the $SiF_n$ radicals and the dopant radicals were introduced at different times, followed by hydrogen plasma treatment to the film (example 9), the crystallinity of the resulting film was not different from a film produced without introducing the dopant radicals (comparative example 9).

TABLE 5

|  | X-ray diffraction intensity (cps) | | |
| --- | --- | --- | --- |
|  | (220) | (111) | (311) |
| Example 9 | 5000 | | |
| Comparative example 9 | 5600 | | |
| Comparative example 10 | 5 | 0 | 0 |

(2) Results of the conductivity measured by the four-points probe method

Table 6 shows the results of the samples. It is understood that the sample of example 9 has not only increased crystallinity but also higher conductivity compared with those of comparative example 9 and 10.

TABLE 6

| Conductivity | Gas introduction (material gas and doping gas) | P dopant | (S/cm) |
| --- | --- | --- | --- |
| Example 9 | at different times | used | 38 |
| Comparative example 9 | only material gas | not used | $1 \times 10^{-7}$ |
| Comparative example 10 | at the same time | used | $3 \times 10^{-1}$ |

Example 10

According to example 10, a polycrystal film was produced in the same manner as example 9, except that the time-period for the treatment with the hydrogen radicals was varied and set up to 0, 2, 5, 10, 20, 30, 50 and 60 seconds per cycle. The thickness of the samples ranged from 800 nm to 900 nm.

Figure 10:
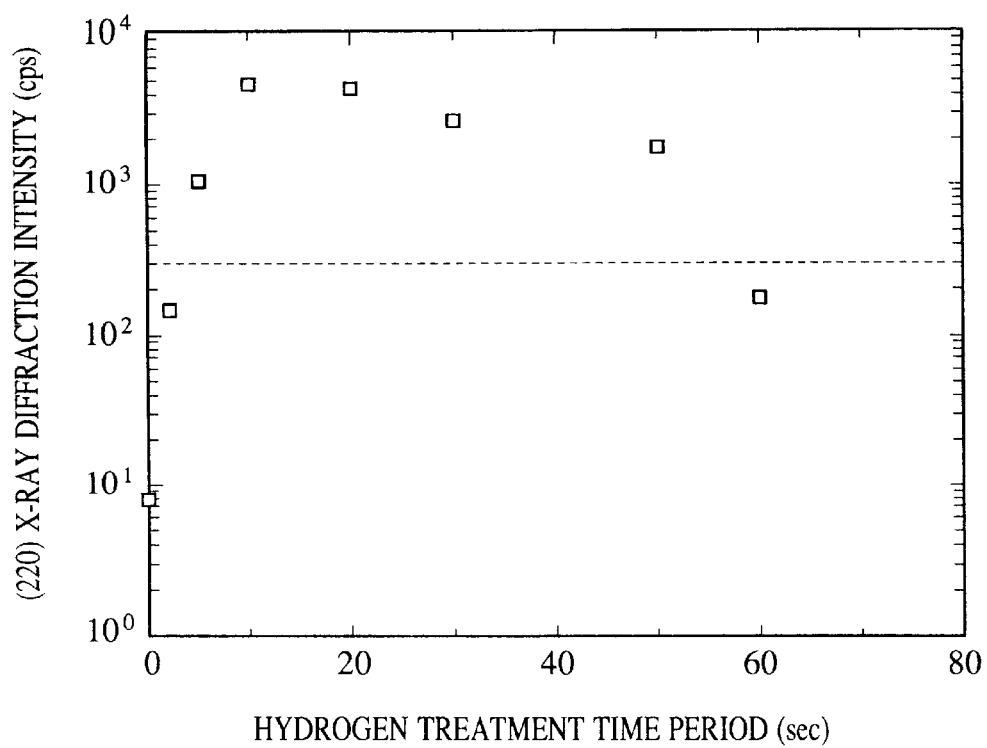
Figure 11:
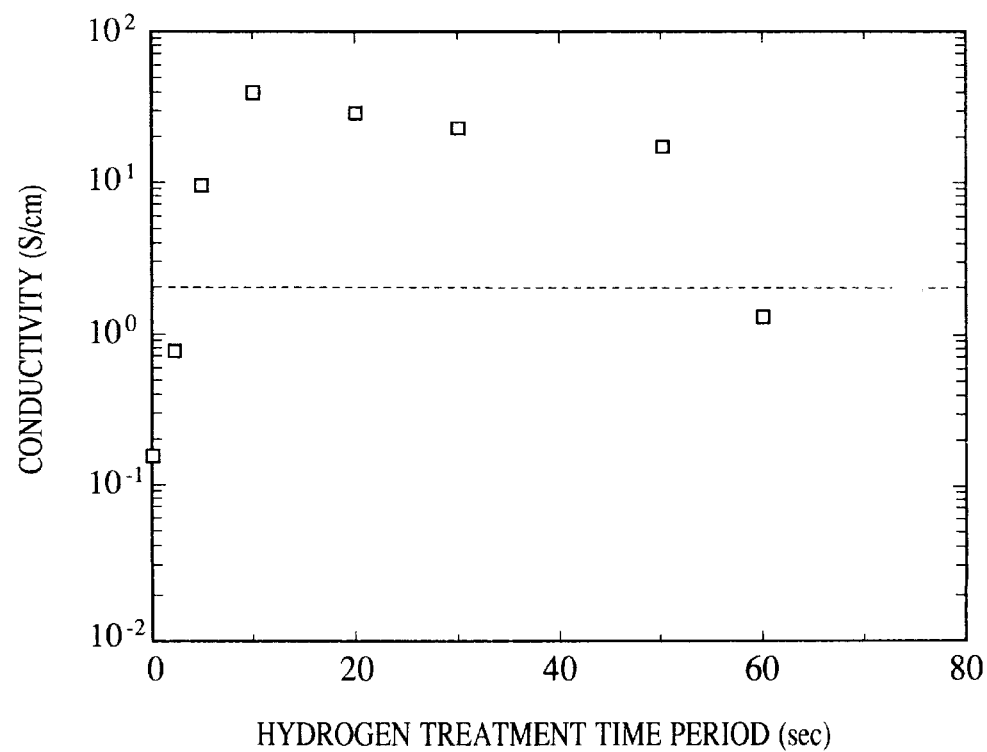

FIG. 10 shows the results of the crystallinity determined by the X-ray diffractometry and FIG. 11 indicates those of the conductivity measured by the four-point probe method. It is understood from FIG. 11 that the time-period for the treatment with the hydrogen radicals per cycle is from 5 to 50 seconds to obtain a polycrystal Si film whose conductivity is 2 S/cm or more.

Example 11

According to example 11, a polycrystal film was produced in the same manner as example 9, except that 15 sccm of $BF_3$ gas diluted to 2% in He was employed as the doping gas.

Comparative Example 11

According to comparative example 11, a polycrystal film was produced in the same manner as comparative example 10, except that 15 sccm of $BF_3$ gas diluted to 2% in He gas was employed as the doping gas.

The results of the crystallinity and conductivity obtained from example 11 and comparative example 11 will be explained in the following. The crystallinity was determined by the X-ray diffractometry and the conductivity was measured by the four-points probe method. The thickness of the samples were 840 nm for example 11 and 860 nm for comparative example 11.

The sample of example 11 indicates a remarkably high peak of 1100 cps at (220) and is confirmed to be an excellent polycrystal Si film. Meanwhile, no peak is observed for the sample of comparative example 11.

The conductivity is 2.3 S/cm for the sample of example 11 and $7 \times 10^{-5}$ S/cm for the sample of comparative example 11.

As afore-described, according to the method of the present invention, it is possible to provide an n-type or p-type polycrystal Si film with excellent crystallinity from a material gas and a doping gas by introducing these gases at different times, without overlapping, which method can proceed at a low temperature and achieve satisfactory structural relaxation of the resultant film. Further, according to the method of the present invention, it is possible to provide an n-type or p-type polycrystal Si film with excellent crystallinity by introducing the $SiF_n$ radicals and the dopant radicals at different times, which method can proceed at a low temperature and achieve satisfactory structural relaxation of the resultant film. Furthermore, according to the method of the present invention, it is possible to provide a polycrystal Si film which exhibits more excellent crystallinity and higher conductivity compared with a crystalline Si film prepared by an ordinary glow discharge plasma technique using $SiH_4$ gas diluted in a large amount of hydrogen gas. Moreover, according to the method of the present invention, it is possible to provide a polycrystal Si film with excellent crystallinity at low cost, which method can proceed at a low temperature. In addition, according to the method of the present invention, it is possible to provide a polycrystal Si film with excellent crystallinity and high conductivity at low cost, which method can proceed at a low temperature.

While the present invention has been described with reference to what are presently considered to be the preferred examples, it is to be understood that the invention is not limited to the disclosed examples. To the contrary, the invention is intended to cover various modifications and equivalent arrangements included within the spirit and scope of the appended claims. For example, another gas may be used for supplying desired atoms in addition to the afore-mentioned dopants. Furthermore, in the case that a material gas and a doping gas are introduced at different times into a deposition space where hydrogen gas has been supplied and activated, the material gas or the doping gas, or both of them may be activated before the introduction. Variations and modifications of the deposition conditions can be made optionally.

What is claimed is:

1. A method for depositing a polycrystal Si film using a material gas, a doping gas and hydrogen gas, said method comprising in sequence:
    (i) depositing the polycrystal Si film over a time-period (a);
    (ii) diffusing dopants in the deposited film over a time-period (b);
    (iii) treating the film surface with hydrogen plasma over a time-period (c); and
    (iv) repeating steps (i), (ii) and (iii) to form the polycrystal Si film.

2. A method for depositing a polycrystal Si film as set forth in claim 1, wherein said time-period (c) is 5 seconds or more.

3. A method for depositing a polycrystal Si film as set forth in claim 1, wherein the hydrogen radicals and a material gas are mixed during said time-period (a).

4. A method for depositing a polycrystal Si film as set forth in claim 1, wherein the hydrogen radicals and the radicals of a material gas are mixed during said time-period (a).

5. A method for depositing a polycrystal Si film as set forth in claim 1, wherein hydrogen gas and a material gas are introduced into a deposition space, mixed, and rendered to plasma therein during said time-period (a).

6. A method for depositing a polycrystal Si film as set forth in claim 1, wherein hydrogen gas and a doping gas are introduced into a deposition space, mixed, and subjected to plasma decomposition therein during said time-period (b).

7. A method for depositing a polycrystal Si film as set forth in claim 1, wherein the hydrogen radicals and a doping gas are mixed during said time-period (b).

8. A method for depositing a polycrystal Si film as set forth in claim 1, wherein the hydrogen radicals and the dopant radicals are mixed during said time-period (b).

9. A method for depositing a polycrystal Si film as set forth in claim 1, wherein neither doping gas nor products thereof are used during said time-period (a).

10. A method for depositing a polycrystal Si film as set forth in claim 1, wherein neither material gas nor products thereof are used during said time-period (b).

11. A method for depositing a polycrystal Si film as set forth in claim 1, wherein neither doping gas nor products thereof are used during said time-period (a) and neither material gas nor products thereof are used during said time-period (b).

12. A method for depositing a polycrystal Si film as set forth in claim 1, wherein the hydrogen radicals alone are introduced during said time-period (c).

13. A method for depositing a polycrystal Si film as set forth in claim 1, wherein during said time-period (c), hydrogen gas alone is introduced and rendered to plasma.

14. A method for depositing a polycrystal Si film as set forth in claim 1, wherein the hydrogen radicals are introduced during said time-periods (a), (b), and (c).

15. A method for depositing a polycrystal Si film as set forth in claim 1, wherein hydrogen gas is introduced into a deposition space during said time-periods (a), (b), and (c).

16. A method for depositing a polycrystal Si film as set forth in claim 1, wherein the thickness of a film deposited during said time-period (a) ranges from 5 nm to 100 nm.

17. A method for depositing a polycrystal Si film as set forth in claim 1, wherein the thickness of a film deposited during said time-period (a) ranges from 5 nm to 50 nm.

18. A method for depositing a polycrystal Si film as set forth in claim 1, wherein the dopant content of the deposited polycrystal Si film is $10^{16}$ cm$^{-3}$ or more.

19. A method for depositing a polycrystal Si film as set forth in claim 1, wherein said dopant is at least an element selected from a group including As, P, B, and Al.

20. A method for depositing a polycrystal Si film as set forth in claim 1, wherein said material gas comprises at least one selected from a group including silicon hydrides, silicon halides, and silicon hydrogen-halides.

21. A method for depositing a polycrystal Si film as set forth in claim 1, wherein said material gas comprises at least one selected from a group including $SiH_4$, $Si_2H_6$, $Si_3H_8$, $SiF_4$, $Si_2F_6$, $SiCl_4$, $Si_2Cl_6$, $SiH_2Cl_2$, $SiH_2F_2$, $SiHCl_3$, and $SiHF_3$.

22. A method for depositing a polycrystal Si film as set forth in claim 1, wherein said material gas is silicon fluoride gas.

23. A method for depositing a polycrystal Si film as set forth in claim 22, wherein said silicon fluoride gas is $SiF_4$ or $Si_2F_6$.

24. A method for depositing a polycrystal Si film as set forth in claim 1, wherein said film is a p-type polycrystal Si film having conductivity of $2 \times 10^{-3}$ S/cm or more.

25. A method for depositing a polycrystal Si film as set forth in claim 1, wherein said film is an n-type polycrystal Si film having conductivity of 2 S/cm or more.

26. A method for depositing a polycrystal Si film as set forth in claim 1, wherein the X-ray diffraction intensity of said polycrystal Si film is 300 cps or more.

27. A method for depositing a polycrystal Si film as set forth in claim 1, wherein said doping gas comprises at least one selected from a group including $PH_3$, $PF_5$, $PF_3$, $ASH_3$, $AsF_3$, $AsF_5$, $PCl_3$, $PCl_5$, $AsCl_3$, $AsCl_5$, $C_4H_{11}P$, $C_4H_{11}As$, $P(CH_3)_5$, $P(C_2H_5)_5$, $As(CH_3)_5$, and $As(C_2H_5)_5$.

28. A method for depositing a polycrystal Si film as set forth in claim 1, wherein said doping gas comprises at least one selected from a group including $BF_3$, $B_2H_5$, $Al(CH_3)_3$, $Al(C_2H_5)_3$, $BCl_3$, $BBr_3$, $B(CH_3)_3$, $B(C_2H_5)_3$, and $BC_4H_{11}$.

29. A method for depositing a polycrystal Si film as set forth in claim 4, wherein said material radicals are the $SiF_n$ radicals (n is a natural number and $n \leq 3$).

30. A method for depositing a polycrystal Si film using a material gas, a doping gas and hydrogen gas, wherein during the film-forming time-period, said hydrogen gas is continuously introduced and high-frequency power is applied continuously to a deposition space, while said material gas and said doping gas are intermittently introduced at different times into said deposition space, said method comprising in sequence:

(i) introducing said material gas and said hydrogen gas into said deposition space during time-period ($t_1$);

(ii) introducing said doping gas and said hydrogen gas into said deposition space during time-period ($t_2$);

(iii) introducing said hydrogen gas alone into said deposition space during time-period ($t_3$); and (iv) repeating steps (i), (ii) and (iii) to form the polycrystal Si film.

31. A method for depositing a polycrystal Si film as set forth in claim 30, wherein said time-period $t_3$ is 10 through 90 seconds.

32. A method for depositing a polycrystal Si film as set forth in claim 30, wherein said material gas is $SiF_4$ or $SiH_4$.

33. A method for depositing a polycrystal Si film as set forth in claim 30, wherein said doping gas is $PH_3$ or $BF_3$.

34. A method for depositing a polycrystal Si film comprising the steps of:

(a) generating hydrogen radicals by supplying energy to hydrogen gas in a first space adjacent to a deposition space;

(b) decomposing a material gas or a doping gas by said hydrogen radicals so as to generate radicals in said first space; and (c) depositing a film by said radicals on a substrate placed in said deposition space;

wherein during the time-period for depositing said film in step (c), said hydrogen gas is continuously introduced and said energy is applied continuously to said first space adjacent to said deposition space and said hydrogen radicals are continuously introduced into said deposition space while said material gas and said doping gas are intermittently introduced at different times into said deposition space, wherein said depositing step (c) comprises in sequence:
(i) introducing said material gas and said hydrogen radicals into the deposition space during time-period ($t_1$);
(ii) introducing said doping gas and said hydrogen radicals into the deposition space during time-period ($t_2$); and
(iii) introducing said hydrogen radicals alone into the deposition space during time-period ($t_3$).

35. A method for depositing a polycrystal Si film as set forth in claim 34, wherein said time-period $t_3$ is 10 through 50 seconds.

36. A method for depositing a polycrystal Si film as set forth in claim 34, wherein said material gas is $SiF_4$ or $SiH_4$.

37. A method for depositing a polycrystal Si film as set forth in claim 35, wherein said doping gas is $PH_3$ or $BF_3$.

38. A method for depositing a polycrystal Si film comprising the steps of:
(a) generating $SiF_n$ (n=1 to 3) radicals, dopant radicals and hydrogen radicals in separate spaces adjacent to a deposition space;
(b) introducing said radicals into said deposition space;
(c) generating said $SiF_1H_m$ ($1+m \leq 3$) radicals by gas-phase collision between said $SiF_n$ radicals and said hydrogen radicals in said deposition space; and
(d) depositing a polycrystal Si film by said $SiF_1H_m$ ($1+m \leq 3$) radicals on a substrate placed in said deposition space, wherein during the time period for depositing said polycrystal Si film, said hydrogen radicals are continuously introduced into said deposition space while said $SiF_n$ radicals and said dopant radicals are intermittently introduced at different times into said deposition space wherein said depositing step (d) comprises in sequence
(i) introducing said $SiF_n$ radicals and said hydrogen radicals into said deposition space during time period ($t_1$);
(ii) introducing said dopant radicals and said hydrogen radicals into said deposition space during time-period ($t_2$ ); and
(iii) introducing said hydrogen radicals alone into said deposition space during time-period ($t_3$).

39. A method for depositing a polycrystal Si film as set forth in claim 38, wherein said time-period $t_3$ is 5 through 50 seconds.

* * * * *

UNITED STATES PATENT AND TRADEMARK OFFICE
CERTIFICATE OF CORRECTION

PATENT NO.     : 5,956,602

DATED          : September 21, 1999

INVENTOR(S)    : SHUNICHI ISHIHARA

It is certified that error appears in the above-identified patent and that said Letters Patent is hereby corrected as shown below:

Title page,

AT [56] REFERENCES CITED

U.S. PATENT DOCUMENTS

"5,242,530  9/1993  Saudhu et al." should read --5,242,530  9/1993  Batey et al.--; and
"5,332,689  7/1994  Batey et al." should read --5,332,689  7/1994  Sandhu et al.--.

COLUMN 1

Line 37, "Plasma" should read --plasma--.

COLUMN 9

Line 30, "SiF$_1$F$_m$" should read --SiH$_1$F$_m$--.

COLUMN 10

Line 38, "ASH$_3$, ASF$_3$, ASF$_5$," should read --AsH$_3$, AsF$_3$, AsF$_5$,--; and
Line 39, "ASCl$_5$," should read --AsCl$_5$,--; and "AS(CH$_3$)$_5$," should read --As(CH$_3$)$_5$,--.

UNITED STATES PATENT AND TRADEMARK OFFICE
CERTIFICATE OF CORRECTION

PATENT NO. : 5,956,602
DATED : September 21, 1999
INVENTOR(S) : SHUNICHI ISHIHARA It is certified that error appears in the above-identified patent and that said Letters Patent is hereby corrected as shown below:

COLUMN 11

Line 34, "above mentioned" should read --above-mentioned--.

COLUMN 14

Line 24, "four-points" should read --four-point--.

COLUMN 21

Line 59, "(i)" should be deleted; and
    Line 60, "100 sccm" should read --(i) 100 sccm--.

Signed and Sealed this

Twenty-ninth Day of August, 2000

Attest:

Attesting Officer

Q. TODD DICKINSON

Director of Patents and Trademarks